(12) United States Patent
Yamaji

(10) Patent No.: US 8,546,889 B2
(45) Date of Patent: Oct. 1, 2013

(54) SEMICONDUCTOR DEVICE AND DRIVING CIRCUIT

(75) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/515,011

(22) PCT Filed: May 24, 2011

(86) PCT No.: PCT/JP2011/061912
§ 371 (c)(1),
(2), (4) Date: Jun. 11, 2012

(87) PCT Pub. No.: WO2011/152253
PCT Pub. Date: Dec. 8, 2011

(65) Prior Publication Data
US 2012/0286829 A1    Nov. 15, 2012

(30) Foreign Application Priority Data

Jun. 4, 2010    (JP) .................................. 2010-128499

(51) Int. Cl.
*H01L 27/088* (2006.01)

(52) U.S. Cl.
USPC ........................................................ 257/390

(58) Field of Classification Search
USPC .................. 257/357, 360, 487, 390, 392, 347
See application file for complete search history.

(56) References Cited

U.S. PATENT DOCUMENTS

| | | | |
|---|---|---|---|
| 5,894,156 A | 4/1999 | Terashima et al. | |
| 6,326,831 B1 | 12/2001 | Kumagai | |
| 7,582,938 B2 * | 9/2009 | Chen | 257/357 |
| 7,615,417 B2 * | 11/2009 | Manna et al. | 438/133 |
| 7,638,848 B2 * | 12/2009 | Okazaki | 257/355 |
| 7,679,143 B2 * | 3/2010 | Suzuki et al. | 257/355 |
| 8,390,069 B2 * | 3/2013 | Kusunoki | 257/360 |
| 2005/0161761 A1 | 7/2005 | Hatade | |
| 2005/0194656 A1 | 9/2005 | Shimizu | |
| 2007/0013022 A1 | 1/2007 | Shimizu | |
| 2007/0063293 A1 | 3/2007 | Terashima | |
| 2009/0212373 A1 | 8/2009 | Karino et al. | |
| 2011/0204447 A1 * | 8/2011 | Wang et al. | 257/360 |

FOREIGN PATENT DOCUMENTS

| | | |
|---|---|---|
| JP | 09-283716 A | 10/1997 |
| JP | 11-243152 A | 9/1999 |
| JP | 2000-252809 A | 9/2000 |
| JP | 2001-237381 A | 8/2001 |

(Continued)

OTHER PUBLICATIONS

ISR Aug. 30, 2011 for PCT/JP/2011/061912.

*Primary Examiner* — Nathan Ha
(74) *Attorney, Agent, or Firm* — Rossi, Kimms & McDowell, LLP

(57) ABSTRACT

A high breakdown voltage semiconductor device includes: an $n^-$ type region (101) surrounded by a $p^-$ well region (102) on a $p^-$ type silicon substrate (100); a drain $n^+$ region (103) connected to a drain electrode (120); a p base region (105) formed so as to surround the drain $n^+$ region (103); a source $n^+$ region (114) formed in the p base region (105); and a $p^-$ region (131) for isolating the $n^-$ type region (101) into an $n^-$ type region (101a) including the drain $n^+$ region (103), and an $n^-$ type region (101b) not having the drain $n^+$ region (103). The $n^-$ type region (101b) is connected to the drain electrode (120) or the drain $n^+$ region (103) via an n offset region (104) or a polysilicon (304) which is a high resistance element.

20 Claims, 17 Drawing Sheets

(56) References Cited

FOREIGN PATENT DOCUMENTS

| | | |
|---|---|---|
| JP | 2005-086182 A | 3/2005 |
| JP | 3635975 B2 | 4/2005 |
| JP | 2005-209983 A | 8/2005 |
| JP | 2005-251903 A | 9/2005 |
| JP | 2007-027358 A | 2/2007 |
| JP | 2007-088198 A | 4/2007 |
| JP | 03-917211 B2 | 5/2007 |
| JP | 2009-206284 A | 9/2009 |

* cited by examiner

ND DRIVING
SEMICONDUCTOR DEVICE AND DRIVING CIRCUIT

This application is a U.S. National Phase Application of PCT International Application PCT/JP2011/061912 filed on May 24, 2011 which is based on and claims priority from JP2010-128499 filed on Jun. 4, 2010 the contents of which is incorporated herein in its entirety by reference.

TECHNICAL FIELD

The present invention relates to a semiconductor device and a driving circuit.

BACKGROUND ART

Power devices have been widely used in a large number of fields such as inverters for motor control, and furthermore, power source applications for large capacity PDPs (plasma display panels), liquid crystal panels, and the like, and inverters for home electrical appliances including air conditioners and light fixtures. Conventionally, driving and control of such power devices have been performed by an electronic circuit formed of a combination of semiconductor elements such as photo couplers and electronic components such as transformers.

However, a recent advancement of a LSI (large scale integration) technology has put high breakdown voltage ICs up to 1200 V to practical use. As a result, as high breakdown voltage ICs, those including high-side gate drivers and low-side gate drivers of power semiconductor devices, further, those including control circuits and power semiconductor devices integrated on the same semiconductor substrate, and the like have been grouped. This contributes to the enhancement of efficiency of the whole inverter system, and the reduction of the component count and the mounting area.

FIG. 16 is a circuit diagram of a high breakdown voltage IC including a general level shift circuit therein. FIG. 16 is the circuit diagram of the high breakdown voltage IC obtained by adding diodes 41 and 42 to the high breakdown voltage IC shown in FIG. 7 of the following Patent Document 1. In the high breakdown voltage IC shown in FIG. 16, reference numerals 17 and 18 are IGBTs (output power devices) connected in series between the positive electrode side Vdc of a main direct-current power source of a high voltage of, for example 400 V and a common potential COM (ground potential in FIG. 16) which is on the negative electrode side of the main DC power source, and forming, for example, one phase part of a bridge circuit for power inversion of a PWM inverter.

A reference sign OUT is a connection point between an emitter of the IGBT 17 of the upper arm of the bridge circuit, and a collector of the IGBT 18 of the lower arm of the bridge circuit, and an AC output terminal of AC power generated by turning on/off of the IGBT 17 and the IGBT 18 in the complementary manner. A reference sign E2 is an auxiliary DC power source (also called a driver power source) of a low voltage of, for example, 15 V, whose negative electrode is connected to the common potential COM, and whose positive electrode is connected to a positive electrode line Vcc2. A reference sign 20 is a driver for on/off driving the IGBT 18 of the lower arm. The driver 20 operates under the auxiliary DC power source E2.

In the high breakdown voltage IC shown in FIG. 16, other circuit portion than the diodes 41 and 42, the IGBTs 17 and 18, the auxiliary DC power source E2, and the driver 20 is a level shift circuit for driving the IGBT 17 of the upper arm of the bridge circuit. A reference numeral 1 is a high breakdown voltage MOSFET for receiving an ON signal 25 of a pulse formed by a control circuit 61 (low potential side low breakdown voltage circuit), thereby to be brought into conduction. With the voltage drop of a load resistance 3 due to the conduction of the high breakdown voltage MOSFET 1 as a signal, the IGBT 17 is turned on.

A reference numeral 2 is a high breakdown voltage MOSFET for receiving an OFF signal 26 of a pulse formed by the control circuit 61, thereby to be brought into conduction. With the voltage drop of a load resistance 4 due to the conduction of the high breakdown voltage MOSFET 2 as a signal, the IGBT 17 is turned off. The control circuit 61 receives a current supplied from a low voltage power source based on the negative electrode side (the common potential COM) of the main DC power source.

Herein, the high breakdown voltage MOSFET 1 and the high breakdown voltage MOSFET 2, and the load resistance 3 and the load resistance 4 are in general formed equally to each other, respectively. Incidentally, constant voltage diodes 5 and 6 connected in parallel with the load resistances 3 and 4, respectively, have a role of restricting the excessive voltage drop of the load resistances 3 and 4, and protecting NOT circuits 8 and 9 described below. Of the level shift circuit, two high breakdown voltage MOSFETs 1 and 2 are the circuit portions for receiving signals based on the potential of the potential-fixed common potential COM.

On the other hand, the circuit portion surrounded by a broken line of FIG. 16 is a high potential side low breakdown voltage circuit portion (floating potential region) fluctuating in potential, which operates based on the potential of the AC output terminal OUT alternately following the common potential COM and the positive electrode side Vdc of the high voltage main DC power source by ON/OFF of the output IGBTs 17 and 18. A reference numeral E1 in a circuit surrounded by the broken line of FIG. 16 is an auxiliary DC power source (also called a driver power source) of, for example, 15 V, whose positive electrode is connected to a positive electrode line Vcc1, and whose negative electrode is connected to the AC output terminal OUT.

The auxiliary DC power source E1 is a power source based on the AC output terminal OUT. Further, the auxiliary DC power source E1 may be a power source based on the positive electrode side Vdc of the main DC power source when the IGBT 17 is of a p channel type. A circuit formed of NOT circuits 8 and 9, and low-pass filter circuits (which will be hereinafter referred to as LPFs) 30 and 31 at the post stage thereof, a RS flip-flop (which will be hereinafter referred to as a RS latch) 15, a driver 16, and the like operates with the auxiliary DC power source E1 as the power source.

However, the power supply voltage of the load resistance circuit formed of the high breakdown voltage MOSFET 1 and the load resistance 3, or the load resistance circuit formed of the high breakdown voltage MOSFET 2 and the load resistance 4 in which the top ends of the load resistances 3 and 4 are connected to the positive electrode line Vcc1 varies between the total sum of the potentials of the auxiliary DC power source E1 connected to the positive electrode line Vcc1 and the positive electrode side Vdc of the main DC power source, and the potential of the auxiliary DC power source E1 for the following reason: the potential of the AC output terminal OUT varies between the potential of the common potential COM and the potential of the positive electrode side Vdc of the main DC power source.

However, in actuality, reflux diodes (not shown) are connected in parallel with the IGBTs 17 and 18, respectively, with each cathode on the collector side. Whereas, by a negative voltage noise generated by the product of the induced electromotive force of the floating inductance accompanying a PCB (Printed Circuit Board) or the like, and the di/dt flowing through the IGBT, the potential of the AC output terminal OUT may become a negative value by about several tens of volts with respect to the potential of the common potential COM.

Then, a description will be given to the operation of the level shift circuit of the high breakdown voltage IC shown in FIG. 16. By the ON signal 25 inputted to the gate of the high breakdown voltage MOSFET 1, a current is passed through the high breakdown voltage MOSFET 1, resulting in the occurrence of voltage drop in the load resistance 3. When the potential of the bottom end of the load resistance 3 becomes equal to or smaller than the threshold value of the NOT circuit 8 due to the voltage drop of the load resistance 3, the output from the NOT circuit 8 becomes Hi.

A Hi level signal outputted from the NOT circuit 8 is inputted to a set terminal S of the RS latch 15 via a LPF 30, so that an output Q from the RS latch 15 becomes Hi. As a result, the IGBT 17 is turned on via the driver 16. At the same time (strictly, at a time point slightly before the ON time point for prevention of a short-circuit between the arms), the IGBT 18 is turned off by a signal from the control circuit 61 via the driver 20.

Then, by the OFF signal 26 inputted to the gate of the high breakdown voltage MOSFET 2, a current is passed through the high breakdown voltage MOSFET 2, resulting in the occurrence of voltage drop in the load resistance 4. When the potential of the bottom end of the load resistance 4 becomes equal to or smaller than the threshold value of the NOT circuit 9 due to the voltage drop of the load resistance 4, the output from the NOT circuit 9 becomes Hi.

A Hi level signal outputted from the NOT circuit 9 is inputted to a reset terminal R21 of the RS latch 15 via the LPF 31, so that an output Q from the RS latch 15 becomes Lo. As a result, the IGBT 17 is turned off via the driver 16. At the same time (strictly, at a time point slightly after the OFF time point for prevention of a short-circuit between the arms), the IGBT 18 is turned on by a signal from the control circuit 61 via the driver 20.

Incidentally, when the IGBT 18 is turned off, and the IGBT 17 is turned on, the source-drain capacitances Cds of the high breakdown voltage MOSFETs 1 and 2 are charged by a sharp potential increase dV/dt occurring in the AC output terminal OUT due to switching of the IGBTs 17 and 18. The charging current at this step causes an abnormal voltage drop different from the voltage drop due to the ON signal 25 or the OFF signal 26 during the normal operation of the level shift circuit in the load resistances 3 and 4. The abnormal voltage drops in the load resistances 3 and 4 cause the RS latch 15 to malfunction, which may erroneously turn on the IGBT 17, to entail a short-circuit between the arms of the bridge circuit, or may unnecessarily turn off the IGBT 17.

The abnormal voltage drops in the load resistances 3 and 4 may also be caused by an external noise other than being caused by switching of the IGBTs 17 and 18. The LPFs 30 and 31 are inserted in order to prevent such malfunction of the RS latch 15, and has a role of removing input signals with a small pulse width (with a high frequency) based on switching of the IGBTs 17 and 18 or an external noise as abnormal signals.

Incidentally, the reason why the IGBTs 17 and 18 are on/off driven using the ON signal 25 and the OFF signal 26 which are pulse signals as in the circuit of FIG. 16 is as follows. In order to high-speed switch AC output signals of a PWM inverter or the like, it is desirable to raise the carrier frequency for turning on/off the output switching element, and accordingly, to operate the level shift circuit at a high speed. Further, raising of the carrier frequency for turning on/off the switching element leads to a higher frequency. This can reduce the size of the coil in a power source board such as an inverter system, resulting in a merit that the PCB area can be reduced.

In order to operate the level shift circuit at a high speed, it is necessary to pass a relatively large current through the high breakdown voltage MOSFETs 1 and 2 for the level shift circuit. However, particularly when the reference potential of the high potential side low breakdown voltage circuit portion fluctuating in reference potential as the circuit portion surrounded by the broken line of FIG. 16 is at a high potential, the loss due to the current passed through the high breakdown voltage MOSFETs 1 and 2 increases.

For example, the ON current of the high breakdown voltage MOSFETs 1 and 2 is set at 10 mA; and the voltage of the positive electrode side Vdc of the main DC power source, at 400 V. Thus, if the signal for turning on the gates of the high breakdown voltage MOSFETs 1 and 2 is driven by a pulse generator, the average loss of the high breakdown voltage MOSFETs 1 and 2 when the on/off duty cycle of the high breakdown voltage MOSFETs 1 and 2 is assumed to be an average of 10% becomes a value of about 0.4 W.

Further, for example, the following Patent Document 2 describes a high breakdown voltage IC including a high-side gate driver of a power device and a level shift circuit therein. In the high breakdown voltage IC of the following Patent Document 2, for a connection between the high breakdown voltage MOSFET for level shift and a isolation island region (floating potential region), the connection is established by a wire formed on a semiconductor substrate via an insulation film. To this end, a substrate-exposed region is disposed between the high breakdown voltage MOSFET and the isolation island region. Thus, when the wire connecting the high breakdown voltage MOSFET and the isolation island region is applied with a high potential, the depletion layer expanding from the high breakdown voltage MOSFET and the depletion layer expanding from the isolation island region are joined to each other. This results in an increase in potential of the substrate-exposed region under the wire.

[Patent Document 1] Japanese Patent Publication No.

[Patent Document 2] Japanese Patent Publication No. 3917211

However, as described above, in the high breakdown voltage IC shown in FIG. 16, when the IGBT 18 is turned off, and the IGBT 17 is turned on, switching of the IGBTs 17 and 18 causes a sharp potential increase, a so-called dV/dt surge in the AC output terminal OUT. This results in a large fluctuation of the potential of the AC output terminal OUT. Further, by the fluctuation of the potential of the AC output terminal OUT, the potential of the positive electrode line Vcc1 connected to the positive electrode of the auxiliary DC power source E1 also fluctuates similarly to the fluctuation of the potential of the AC output terminal OUT.

Below, a description will be given to the malfunction caused by fluctuation of the voltage of the AC output terminal OUT and the voltage of the auxiliary DC power source E1. The high breakdown voltage MOSFETs 1 and 2 have parasitic output capacitances 51 and 52 including the source-drain capacitance Cds and a substrate-drain capacitance Cdsub as the output capacitance accounting for a large proportion of the parasitic capacitance formed upon an increase in drain potential. Upon generation of the dV/dt surge in the AC output terminal OUT, a transient current according to the dV/dt surge flows from the positive electrode side of the auxiliary DC power source E1 to the common potential COM to which the sources of the high breakdown voltage MOS- FETs 1 and 2 are connected via the parasitic output capacitances 51 and 52. This results in the same state as that in which the high breakdown voltage MOSFETs 1 and 2 are apparently turned on.

When the high breakdown voltage MOSFETs 1 and 2 are put in the same state as that in which they are apparently turned on, false signals due to a displacement current are generated in the nodes connected to the drains of the high breakdown voltage MOSFET 1 on the ON signal side, and the high breakdown voltage MOSFET 2 on the OFF signal side. At this step, even when signals by the normal operation are inputted to the high breakdown voltage MOSFET 1 on the ON signal side or the high breakdown voltage MOSFET 2 on the OFF signal side, the signals by the normal operation inputted to the gates of the high breakdown voltage MOSFETs 1 and 2 do not become a transfer signal to the node of the post stage during the period in which the displacement current charges the parasitic output capacitances 51 and 52 of the high breakdown voltage MOSFETs 1 and 2. For this reason, a delay time occurs.

Whereas, a consideration will be given to the case where the parasitic output capacitance 52 of the high breakdown voltage MOSFET 2 on the OFF signal side is assumed to vary about 10% on the high side due to variations in manufacturing. In this case, by the voltage drop of the potential difference due to the product of the capacitance of the parasitic output capacitance 52, the displacement current due to the dV/dt surge, and the resistance of the load resistance 4, the potential of the bottom end of the load resistance 4 becomes equal to or smaller than the threshold value of the NOT circuit 9. As a result, a Hi level signal is outputted from the node connected to the drain of the high breakdown voltage MOSFET 2.

The Hi level signal outputted from the node connected to the drain of the high breakdown voltage MOSFET 2 is inputted to the reset terminal R of the RS latch 15 via the LPF 31. As a result, the reset terminal R of the RS latch 15 has precedence, so that the output Q from the RS latch 15 becomes Lo. Consequently, the IGBT 17 is turned off via the driver 16, which causes the high breakdown voltage IC to malfunction.

A description will be given to such a malfunction of the high breakdown voltage IC. By fluctuations of the potential of the AC output terminal OUT and the potential of the auxiliary DC power source E1 due to the dV/dt surge, the displacement current I1 transiently flows through the high breakdown voltage MOSFET 1 on the ON signal side, and the displacement current I2 flows through the high breakdown voltage MOSFET 2 on the OFF signal side. In the high breakdown voltage IC shown in FIG. 16, in order to pass a surge current to the common potential COM, diodes 41 and 42 are connected between the drain of the high breakdown voltage MOSFET 1 on the ON signal side and the AC output terminal OUT, and between the drain of the high breakdown voltage MOSFET 2 on the OFF signal side and the AC output terminal OUT, respectively.

Herein, during the potential fluctuations due to the dV/dt surge, the displacement current components flowing through the diodes 41 and 42 correspond to i1 and i2 of FIG. 16, respectively, and the displacement current components flowing through the load resistances 3 and 4 correspond to i1' and i2' of FIG. 16, respectively. The displacement currents I1 and I2 are expressed as I1=i1+i1' and I2=i2+i2', respectively.

Thus, in the high breakdown voltage IC through which the displacement currents I1 and I2 flow, first, by the dV/dt surge caused in the AC output terminal OUT, not only the potential of the AC output terminal OUT but also the potential of the positive electrode line Vcc1 to which the positive electrode of the auxiliary DC power source E1 is connected also increase with an increase in potential of the AC output terminal OUT. For this reason, immediately after fluctuations of the potentials due to the dV/dt surge, minute displacement current components i1' and i2' flow to the common potential COM via the load resistances 3 and 4 and the high breakdown voltage MOSFETs 1 and 2, respectively.

Then, the voltage drop due to the minute displacement current component i1' and the load resistance 3, and the voltage drop due to the minute displacement current component i2' and the load resistance 4 become equal to or more than the potential difference (herein assumed to be 15 V) between the positive electrode line Vcc1 and the AC output terminal OUT, and 0.6 V or more lower than the potential of the AC output terminal OUT. As a result, a current starts to flow in the forward direction of the diodes 41 and 42. Namely, in most of the displacement currents I1 and I2 upon a sharp dV/dt surge of about several tens kV/μs, the displacement current components i1 and i2 flowing along the diodes 41 and 42 become predominant. The displacement currents I1 and I2 charge the parasitic output capacitances 51 and 52 of the high breakdown voltage MOSFETs 1 and 2.

When the displacement currents i1 and i2 upon a sharp dV/dt surge of about several tens kV/μs pass along the diodes 41 and 42 to charge the parasitic output capacitances 51 and 52 of the high breakdown voltage MOSFETs 1 and 2, the voltage drop across both the ends of the load resistances 3 and 4 becomes 15.6 V or more. Accordingly, both the outputs from the NOT circuits 8 and 9 become Hi level signals. Thus, the RS latch (RS flip-flop) 15 cannot discriminate between a set signal and a reset signal. Therefore, the RS latch 15 does not accept the Hi level signals from the NOT circuits 8 and 9 as signals, so that the high breakdown voltage IC is not brought into malfunction.

However, when a gentle dV/dt surge of several kV/μs is inputted to the AC output terminal OUT, in most of the displacement currents I1 and I2, the minute displacement current components i1' and i2' flowing through the load resistances 3 and 4 become predominant. Accordingly, when the voltage drop due to the minute displacement current components i1' and i2' and the load resistances 3 and 4 results in just the vicinity of the Vth (threshold voltage) of the NOT circuits 8 and 9, the NOT circuits 8 and 9 may transfer a false signal generated by the gentle dV/dt surge to the node at the post stage.

For example, the Vth voltage of the NOT circuits 8 and 9 is caused by respective current driving abilities of a NMOS and a PMOS of a CMOS inverter formed of the NMOS and the PMOS. If the current driving abilities of the NMOS and the PMOS are assumed to be equal, the Vth voltage of the NOT circuits 8 and 9 becomes potential difference between the positive electrode line Vcc1 to which the positive electrode of the auxiliary DC power source E1 is connected and the AC output terminal OUT/2=7.5 (V).

Herein, a description will be given to the false signal generated with the displacement current components i1' and i2' as a trigger by taking, as an example, the case where the high breakdown voltage MOSFET 1 on the ON signal side and the high breakdown voltage MOSFET 2 on the OFF signal side are different in parasitic capacitance component from each other as described above. As described above, when a gentle dV/dt surge of several kV/μs is inputted to the AC output terminal OUT, minute displacement current components i1' and i2' flow between the positive electrode line Vcc1 to which the positive electrode of the auxiliary DC power source E1 is connected and the AC output terminal OUT.

When the current value of any one of the minute displacement current components i1' and i2' exceeds 1.5 mA (the Vth voltage of the NOT circuits 8 and 9 of 7.5 V/load resistance 5.0 kΩ), a false signal is outputted from the NOT circuit through which a minute displacement current component of 1.5 mA or more flowed of the NOT circuit 8 through which the minute displacement current component i1' flows and the NOT circuit 9 through which the minute displacement current component i2' flows. The false signal outputted from the NOT circuit is inputted as a Hi level signal to the RS latch 15. Accordingly, the false signal is transferred to the output Q of the RS latch 15.

Specifically, the estimates of the voltage drops on the ON-signal side and on the OFF-signal side of the false signal due to the gentle dV/dt surge are, for example, as follows.

Synthetic capacitance Cn1 of parasitic output capacitance 51 (Cds+Cdsub) of high breakdown voltage MOSFET 1:

$$Cn1=2(pF)$$

Synthetic capacitance Cn2 of the parasitic output capacitance 52 (Cds+Cdsub) of the high breakdown voltage MOSFET 2:

$$Cn2=2.2(pF)(\text{assumed as a 10\% increase due to manufacturing fluctuations})$$

Further, assuming that the resistance values of the load resistances 3 and 4 are respectively 5.0 kΩ, when a 0.7-kV/μs dV/dt surge is inputted to the AC output terminal OUT, Voltage drop Vs1 of the node connected to the load resistance 3 on the ON signal side (the side through which the displacement current component i1' flows):

$$Vs1=2\times10^{-12}\times0.7\times10^{3}/1\times10^{-6}\times5\times10^{3}=7.0(V)$$

Voltage drop Vr1 of the node connected to the load resistance 4 on the OFF signal side (the side through which the displacement current component i2' flows):

$$Vr1=2.2\times10^{-12}\times0.7\times10^{3}/1\times10^{-6}\times5\times10^{3}=7.7(V)$$

Thus, the voltage drop Vr1 of the node connected to the load resistance 4 on the OFF signal side exceeds the Vth voltage=7.5 V of the NOT circuit 9. Accordingly, only the NOT circuit 9 erroneously outputs a Hi level signal.

In order to reduce such outputting of a false signal, for example, it can be considered that the resistance values of the load resistances 3 and 4 for level shift are reduced from 5 kΩ to 1 kΩ or the like. However, there is the following problem. The ON current of the high breakdown voltage MOSFETs 1 and 2 is assumed to be set at a saturation current of 10 mA when the resistance value of the load resistances 3 and 4 is 5 kΩ. In this case, when the resistance value of the load resistances 3 and 4 is 1 kΩ, a saturation current of 50 mA is required to be passed through the high breakdown voltage MOSFETs 1 and 2.

The saturation current of the high breakdown voltage MOSFETs 1 and 2 is set at 50 mA, and the voltage of the positive electrode side Vdc of the main DC power source is set at 400 V. Thus, if the signal for turning on the gates of the high breakdown voltage MOSFETs 1 and 2 is driven by a pulse generator, the average loss of the high breakdown voltage MOSFETs 1 and 2 with the collector potential of the IGBT 17 being high is about 2.0 W when the on/off duty cycle of the high breakdown voltage MOSFETs 1 and 2 is assumed to be an average of 10%. For this reason, the average loss of the high breakdown voltage MOSFETs 1 and 2 largely exceeds the allowable loss of the package for resin-sealing the high breakdown voltage IC.

Generally, even only the heat allowable loss of the SOP (Small Outline Package) enhanced in heat-dissipating capability is about 0.8 W. In order to set the heat allowable loss of the package at 0.8 W or less, the ON/OFF duty of the high breakdown voltage MOSFETs 1 and 2 is required to be reduced to 4% or less. However, when the ON duty of the high breakdown voltage MOSFETs 1 and 2 is shortened, particularly when the high breakdown voltage IC is used with a high switching frequency of from several hundreds kHz to several MHz for use in smaller-capacitance power supply equipment, the relationship with the delay time according to the input capacitance or the output capacitance of the level shift circuit, the input capacitances of the post-stage buffer circuits (such as the NOT circuits 8 and 9, and the LPFs 30 and 31) and the driver 16 may become a problem.

In the case of the high breakdown voltage IC including therein the general level shift circuit and floating potential region as shown in FIG. 16, the transfer delay time of turn ON/OFF from the load resistance circuit formed of the high breakdown voltage MOSFET 1 and the load resistance 3, or the load resistance circuit formed of the high breakdown voltage MOSFET 2 and the load resistance 4 to the driver 16 becomes about 100 ns under the influences of the parasitic output capacitances 51 and 52.

Namely, when the oscillation frequency of the high breakdown voltage IC is set at 1 MHz, the 10% duty becomes an ON period of 100 ns. This causes the restriction that the ON duty of 10% duty or less, and the OFF duty of 90% or more cannot be set. For this reason, even when driving is performed with an ON/OFF duty of the high breakdown voltage MOSFETs 1 and 2 of 4% or less in order to reduce the average loss of the high breakdown voltage MOSFETs 1 and 2, the ON signal may not be transferred according to the transfer delay time.

The signal level of the false signal generated by the displacement current due to the dV/dt surge largely depends on the capacitance values of the parasitic output capacitances 51 and 52 of the high breakdown voltage MOSFETs 1 and 2 shown in FIG. 16. On the other hand, the floating capacitance under the NOT circuits 8 and 9, the LPFs 30 and 31, and other metal wires, and the like affect the signal level of the false signal generated by the displacement current due to the dV/dt surge to a less degree as compared with the capacitance values of the parasitic output capacitances 51 and 52 of the high breakdown voltage MOSFETs 1 and 2.

Therefore, in order to reduce the displacement currents I1 and I2 causing malfunction based on the dV/dt surge while suppressing the allowable loss of the high breakdown voltage IC, it is very effective to reduce the output capacitances of the high breakdown voltage MOSFETs 1 and 2.

FIG. 17 is a plan view showing an essential part of a high breakdown voltage IC in which a level shift circuit including conventional high breakdown voltage MOSFETs and a driving circuit including a floating potential region are formed in the same semiconductor substrate. Whereas, FIG. 18 is a cross-sectional view showing an essential part of a conventional high breakdown voltage MOSFET. FIG. 18 is a cross-sectional view showing an essential part of a high breakdown voltage MOSFET for use in a conventional level shift circuit. FIG. 18(a) and FIG. 18(b) are both essential-part cross-sectional views along the cut line X-X' of FIG. 17.

As shown in FIGS. 17 and 18, in a conventional level shift circuit, each planar shape of high breakdown voltage MOSFETs 11 and 11b which are level shift elements is laid out in a circular form. A bonding wire 201 is connected by wire bonding from the drain pad of the drain electrode 120 connected to a drain $n^+$ region 103 formed in the center of the high breakdown voltage MOSFET 11 or 11b to the floating potential region 300.

The conventional high breakdown voltage MOSFETs 11 and 11b correspond to the high breakdown voltage MOSFETs 1 and 2 shown in FIG. 16, respectively, and are each used as a level shift element functioning as an interface between the high voltage and the low voltage of the high breakdown voltage IC called a gate driver IC. As shown in FIG. 18(*a*), the high breakdown voltage MOSFET 11 has the following respective regions. In the surface layer of a p⁻ type silicon substrate 100, an n⁻ type region 101 is formed. The surface concentration of phosphorus impurities of the n⁻ type region 101 may be $1 \times 10^{15}/\text{cm}^3$ or more and $1 \times 10^{16}/\text{cm}^3$ or less. The depth Xj of the n⁻ type region 101 may be 7 μm or more and 10 μm or less.

In the surface layer of the n⁻ type region 101, selectively, a drain n⁺ region 103 and an n offset region 104 are formed. The n offset region 104 surrounds the drain n⁺ region 103. The surface concentration of phosphorus impurities of the n offset region 104 may be $1 \times 10^{17}/\text{cm}^3$ or more and $1 \times 10^{18}/\text{cm}^3$ or less. The depth Xj of the n offset region 104 may be 1 μm or more and 2 μm or less.

Further, in the surface layer of the n⁻ type region 101, a p⁻ well region 102 is formed. The p⁻ well region 102 is a region surrounding the peripheral part of the n⁻ type region 101, and connected to a ground Gnd (the common potential COM). The surface concentration of boron impurities of the p⁻ well region 102 may be $1 \times 10^{15}/\text{cm}^3$ or more and $1 \times 10^{18}/\text{cm}^3$ or less. The depth Xj of the p⁻ well region 102 may be 10 μm or more and 13 μm or less. The p⁻ well region 102 is formed with a depth reaching the p⁻ type silicon substrate 100.

Whereas, between the p⁻ well region 102 and the n⁻ type region 101, a p base region 105 is formed. The p base region 105 also functions as a channel region. The surface concentration of boron impurities of the p base region 105 may be $1 \times 10^{16}/\text{cm}^3$ or more and $1 \times 10^{19}/\text{cm}^3$ or less. The depth Xj of the p base region 105 may be 4.0 μm or more and 5.5 μm or less. In the surface layer of the p⁺ base region 105, selectively, a base pickup p⁺ region 113 and a source n⁺ region 114 of the high breakdown voltage MOSFET 11 are formed.

On the p base region 105, a gate electrode 115 of the high breakdown voltage MOSFET 11 is formed via a gate oxide film. The gate electrode 115 is formed of, for example, polysilicon. On the n⁻ type region 101, there are formed a drain electrode 120 of the high breakdown voltage MOSFET 11 connected to the drain n⁺ region 103, and a source electrode 121 of the high breakdown voltage MOSFET 11 connected to the source n⁺ region 114.

Whereas, on the n⁻ type region 101, there are formed a LOCOS (Local Oxidation of Silicon) 151 of a field oxide film, an interlayer insulation film 152 of TEOS (Tetra Ethyl Ortho Silicate), BPSG (Boro-Phospho Silicate Glass) or the like, and a passivation film 153 formed of a silicon oxide film and a silicon nitride film by plasma CVD.

The LOCOS 151 covers the n⁻ type region 101 exposed between the p base region 105 and the n offset region 104. The interlayer insulation film 152 insulates the gate electrode 115, the drain electrode 120, and the source electrode 121 from one another. The passivation film 153 protects the MOS gate structure of the drain n⁺ region 103, the source n⁺ region 114, the gate electrode 115, the drain electrode 120, the source electrode 121, and the like of the high breakdown voltage MOSFET 11.

In the high breakdown voltage MOSFET 11 shown in FIG. 18(*a*), there are shown output capacitance components (Cds1, Cds2, and Cdsub) accounting for a large proportion of the parasitic capacitances formed upon a transient increase in drain potential of the high breakdown voltage MOSFET 11 by the sharp rise in the potential of the AC output terminal OUT due to the dV/dt surge. The input capacitance components (Cgd and Cgs) of the high breakdown voltage MOSFET 11 are about several % of the whole parasitic capacitance of the high breakdown voltage MOSFET 11, and hence, are not shown.

Of the output capacitance components shown in FIG. 18(*a*), the source-drain capacitance Cds includes an output capacitance component Cds1 formed of the junction of the p well region 102, the p base region 105, and the n⁻ type region 101, and an output capacitance component Cds2 parasitic to the LOCOS 151 formed between the source electrode 121 jutting out in the direction of the drain n⁺ region 103 as a field plate on the negative electrode side and the immediately underlying n⁻ type region 101.

Namely, the source-drain capacitance Cds is the total sum (Cds=Cds1+Cds2) of the output capacitance component Cds1 and the output capacitance component Cds2. As a result of performing C-V characteristic simulation under the conditions of a small signal model AC frequency of 1 MHz, the source-drain capacitance Cds when the drain potential is 30 V has a capacitance value of roughly about 0.4 pF.

Further, out of the output capacitance components shown in FIG. 18(*a*), the substrate-drain capacitance Cdsub is formed of the junction between the p⁻ type silicon substrate 100 and the n⁻ type region 101. The substrate-drain capacitance Cdsub shows the largest proportion of the parasitic capacitance components of the high breakdown voltage MOSFET 11. As a result of performing C-V characteristic simulation under the conditions of a small signal model AC frequency of 1 MHz, the substrate-drain capacitance Cdsub when the drain potential is 30 V has a capacitance value of roughly about 1.6 pF.

Further, FIG. 18(*b*) shows another example of the high breakdown voltage MOSFET for use in the high breakdown voltage IC shown in FIG. 17. Referring to FIG. 18(*b*), on an SOI (Silicon On Insulator) substrate in which on a p⁻ type silicon substrate 100, an n⁻ type silicon substrate 401 is formed via a silicon oxide film 200 with a thickness of several μm or more, the high breakdown voltage MOSFET 11b is formed. The p⁻ well region 102 is formed so as to be in contact with the silicon oxide film 200.

Other regions formed in the n⁻ type silicon substrate 401 of the high breakdown voltage MOSFET 11b are formed in the same manner as the region formed in the n⁻ type region 101 of the high breakdown voltage MOSFET 11 shown in FIG. 18(*a*). Such a high breakdown voltage MOSFET 11b also has a source-drain capacitance Cds (=Cds1+Cds2) as with the high breakdown voltage MOSFET 11 shown in FIG. 18(*a*).

In order to reduce the output capacitance component of the high breakdown voltage MOSFET 11 forming a circular planar shape, it can be considered to reduce the PN junction area of the p base region 105 connected to the ground Gnd (the common potential COM), the p⁻ well region 102, and the p⁻ type silicon substrate 100, and the n⁻ type region 101 which is a drift region (breakdown voltage region). The reduction of the PN junction area can reduce the drain-source capacitance Cds and the substrate-drain capacitance Cdsub.

However, generally, the reduction of the PN junction area formed of a region forming a circular planar shape results in the reduction of the diameter of the region forming a circular planar shape. Namely, in the high breakdown voltage MOSFET 11, the reduction of the diameter of the region forming a circular planar shape results in shortening of the drift length Ld of the drift region (breakdown voltage region). The shortening of the drift length Ld leads to the reduction of the breakdown voltage of the high breakdown voltage MOSFET 11.

This requires the reduction of only the output capacitance while keeping the diameter of the circular shape of the high breakdown voltage MOSFET 11. Also with the high breakdown voltage MOSFET 11b, there occurs the same problem that the reduction of the PN junction area results in the reduction of the breakdown voltage as that with the high breakdown voltage MOSFET 11. For this reason, also with the high breakdown voltage MOSFET 11b, there is the same problem that only the output capacitance is reduced with the diameter of the circular shape being kept as with the high breakdown voltage MOSFET 11.

Further, in the Patent Document 2, there is a description on the one in which the breakdown voltage structure of the high breakdown voltage MOSFET for level shift and the breakdown voltage structure of the isolation island region are shared in common. However, there is no description at all on those respectively forming the breakdown voltage structure of the high breakdown voltage MOSFET and the breakdown voltage structure of the isolation island region. Further, there is also no description on the output capacitance of the high breakdown voltage MOSFET.

DISCLOSURE OF THE INVENTION

In order to solve the foregoing problems with the related-art technologies, it is an object of this invention to provide a semiconductor device with a high switching response speed. Further, in order to solve the foregoing problems with the related-art technologies, it is another object of this invention to provide a driving circuit suppressed in power loss and malfunction.

In order to solve the foregoing problems, and to attain the object of this invention, a semiconductor device in accordance with the present invention, is characterized by including: a second conductivity type breakdown voltage region situated on a first conductivity type semiconductor substrate, a second conductivity type drain diffusion region formed in a surface layer of a part of the breakdown voltage region, a first conductivity type base region formed in contact with the breakdown voltage region in such a manner as to be apart from the drain diffusion region and to surround the drain diffusion region, a first conductivity type pickup region formed in a surface layer of the base region, a first main electrode connected to the pickup region, a second main electrode connected to the drain diffusion region, and to be applied with a higher voltage than a voltage to be applied to the first main electrode, and an isolation region in contact with the semiconductor substrate and surrounding the breakdown voltage region. The breakdown voltage region includes a drift region having the drain diffusion region, and another region not having the drain diffusion region and electrically connected to the drain diffusion region or the second main electrode via a high resistance element. The semiconductor device is characterized by further including: a first conductivity type semiconductor region formed between the drift region and the other region so as to be in contact with the isolation region and the semiconductor substrate and to isolate the drift region and the other region from each other, a second conductivity type source diffusion region situated in a surface layer of the base region in the drift region, and connected to the first main electrode, and a gate electrode formed on a surface of the base region between the drift region and the source diffusion region via an insulation film. The semiconductor device is characterized in that a resistance value R ($\Omega$) of the high resistance element satisfies the following expression (1):

[Eq. 1]

$$R \geq 1/(2\pi \cdot C \cdot fc) \quad (1)$$

where
R: resistance value ($\Omega$) of the high resistance element,
C: output capacitance (F) of the high breakdown voltage semiconductor device, and
fc: switching operation frequency (Hz) of the high breakdown voltage semiconductor device.

Further, in order to solve the foregoing problems, and to attain the object of the present invention, a semiconductor device in accordance with this invention, is characterized by including: a second conductivity type breakdown voltage region situated on a first conductivity type semiconductor substrate, a first conductivity type collector diffusion region formed in a surface layer of a part of the breakdown voltage region, a first conductivity type base region formed in contact with the breakdown voltage region in such a manner as to be apart from the collector diffusion region and to surround the collector diffusion region, a first conductivity type pickup region formed in a surface layer of the base region, a first main electrode in contact with the pickup region, a second main electrode connected to the collector diffusion region, and to be applied with a higher voltage than a voltage to be applied to the first main electrode, and an isolation region in contact with the semiconductor substrate and surrounding the breakdown voltage region. The breakdown voltage region includes a drift region having the collector diffusion region, and another region not having the collector diffusion region and electrically connected to the collector diffusion region or the second main electrode via a high resistance element. The semiconductor device is characterized by further including: a first conductivity type semiconductor region formed between the drift region and the other region so as to be in contact with the isolation region and the semiconductor substrate and to isolate the drift region and the other region from each other, a second conductivity type emitter diffusion region situated in a surface layer of the base region in the drift region, and connected to the first main electrode, and a gate electrode formed on a surface of the base region between the drift region and the emitter diffusion region via an insulation film. The semiconductor device is characterized in that a resistance value R ($\Omega$) of the high resistance element satisfies the foregoing expression (1).

Further, the semiconductor device in accordance with this invention is characterized in that, in the invention, the breakdown voltage region is a diffusion region selectively formed in a surface layer of the semiconductor substrate.

Still further, the semiconductor device in accordance with this invention is characterized in that, in the invention, the isolation region is a diffusion region selectively formed in the surface layer of the semiconductor substrate, and having a higher impurity concentration than that of the semiconductor substrate.

Furthermore, the semiconductor device in accordance with this invention is characterized in that, in the invention, the isolation region is formed of a trench formed from a surface of the semiconductor substrate, and an insulator embedded in the trench.

Further, the semiconductor device in accordance with this invention is characterized in that, in the invention, the first conductivity type semiconductor region is a diffusion region selectively formed in the surface layer of the semiconductor substrate.

Still further, the semiconductor device in accordance with this invention is characterized in that, in the invention, the first conductivity type semiconductor region is a region of the semiconductor substrate exposed at a surface.

Furthermore, the semiconductor device in accordance with this invention is characterized in that, in the invention, the breakdown voltage region is a second conductivity type epitaxial growth layer formed on the semiconductor substrate.

Further, the semiconductor device in accordance with this invention is characterized in that, in the invention, the isolation region is a diffusion region reaching the semiconductor substrate from a surface of the epitaxial growth layer, and having a higher impurity concentration than that of the semiconductor substrate.

Still further, the semiconductor device in accordance with this invention is characterized in that, in the invention, the isolation region is formed of a trench reaching the semiconductor substrate from a surface of the epitaxial growth layer, and an insulator embedded in the trench.

Furthermore, the semiconductor device in accordance with this invention is characterized in that, in the invention, the first conductivity type semiconductor region is formed of a diffusion region reaching the semiconductor substrate from a surface of the epitaxial growth layer.

Moreover, the semiconductor device in accordance with this invention is characterized in that, in the invention, the breakdown voltage region is a region formed at a SOI layer formed on the semiconductor substrate via an insulation film.

Further, the semiconductor device in accordance with this invention is characterized in that, in the invention, the isolation region is a diffusion region reaching the insulation film from a surface of the SOI layer, and having a higher impurity concentration than that of the semiconductor substrate.

Still further, the semiconductor device in accordance with this invention is characterized in that, in the invention, the isolation region is formed of a trench reaching the insulation film from a surface of the SOI layer, and an insulator embedded in the trench.

Still more further, the semiconductor device in accordance with this invention is characterized in that, in the invention, the first conductivity type semiconductor region is a diffusion region reaching the insulation film from a surface of the SOI layer.

Furthermore, the semiconductor device in accordance with this invention is characterized in that, in the invention, the second main electrode or a field plate connected to the second main electrode is formed on the other region via an insulation film.

Moreover, the semiconductor device in accordance with this invention is characterized in that, in the invention, the other region is formed of a plurality of regions, and the first conductivity type semiconductor regions are each provided between the plurality of regions.

Further, the semiconductor device in accordance with this invention is characterized in that, in the invention, the drift region is formed of a plurality of regions, and the first conductivity type semiconductor regions are each provided between the plurality of regions.

Still further, the semiconductor device in accordance with this invention is characterized in that, in the invention, when a higher voltage than a voltage to be applied to the first main electrode is applied to the second main electrode, before occurrence of avalanche breakdown at a PN junction between the first conductivity type semiconductor region and the drift region or the other region, depletion regions extending from the PN junction to the first conductivity type semiconductor region are connected to each other.

Further, a driving circuit in accordance with this invention is a driving circuit for driving gates of one or more output power devices each having one main terminal connected to a positive electrode of a main DC power source, and another main terminal connected to an AC output terminal. The driving circuit is characterized by including: a high potential side low breakdown voltage circuit to be supplied with a current by a first auxiliary DC power source having a lower voltage than that of the main DC power source based on either one of the main terminals of each of the output power devices, and a high breakdown voltage transistor for level shifting a signal from a low potential side low breakdown voltage circuit to be supplied with a current by a second auxiliary DC power source having a lower voltage than that of the main DC power source based on a negative electrode of the main DC power source, and transferring the signal to the high potential side low breakdown voltage circuit. The driving circuit is characterized in that the high breakdown voltage transistor is the semiconductor device in the foregoing invention.

In accordance with the foregoing invention, the high breakdown voltage MOSFET (semiconductor device) is configured such that two or a plurality of breakdown voltage regions each formed of an $n^-$ type region which is a drift region are formed apart from one another, and a $p^-$ region (first conductivity type semiconductor region) is disposed between respective $n^-$ type regions. Alternatively, the high breakdown voltage MOSFET is configured as follows: in one $n^-$ type region of a plurality of $n^-$ type regions formed by isolating the breakdown voltage region, a drain diffusion region having a higher impurity concentration than that of the $n^-$ type region is formed; and other one or more $n^-$ type regions and the drain diffusion region or the drain electrode (second main electrode) are connected via a high resistance element. The drain diffusion region is to be connected to a high potential wire.

By using such a structure, in order for the high breakdown voltage MOSFET to ensure the high breakdown voltage, for example, when the breakdown voltage region forming a circular planar shape has an area equivalent to or larger than that for the current driving ability required of the MOSFET, the parasitic capacitance component in the breakdown voltage region except for the necessary current ability and the like can be nullified according to the switching frequency of the actual use conditions. This can reduce the output capacitance of the high breakdown voltage MOSFET inexpensively. For this reason, when for a level shift circuit, a high breakdown voltage MOSFET is used, it is possible to reduce the displacement current upon the occurrence of a dV/dt surge.

Further, in accordance with the foregoing invention, by reducing the output capacitance of the high breakdown voltage MOSFET, it is possible to accelerate the discharge of the output capacitance upon inputting of an ON signal to the gate of the high breakdown voltage MOSFET. Still further, when the high breakdown voltage MOSFET is used for a level shift circuit, it is possible to shorten the turn on/turn off transfer delay time of the high-side driving circuit part. By shortening the transfer delay time, it also becomes possible to set small the on duty for driving the high breakdown voltage MOSFET.

Still further, in accordance with the foregoing invention, it is possible to set small the on duty for driving the high breakdown voltage MOSFET. Therefore, it is possible to reduce the load resistance portion for level shift of the high breakdown voltage IC while keeping the allowance loss of the package for resin sealing the high breakdown voltage IC. As a result, both of the current value of the displacement current upon the occurrence of the dV/dt surge and the resistance value of the load resistance portion become small while the power loss at the level shift circuit of the high breakdown voltage IC being suppressed. This results in the reduction of the voltage drop at the load resistance portion, which enables the implementation of a driving circuit less likely to malfunction due to the dV/dt surge.

The semiconductor device and the driving circuit in accordance with this invention exert an effect of capable of providing a semiconductor device with a high switching response speed. Further, the semiconductor device and the driving circuit in accordance with the present invention exert an effect of capable of providing a driving circuit suppressed in power loss and malfunction.

BEST MODE FOR CARRYING OUT THE INVENTION

Figure 1A:
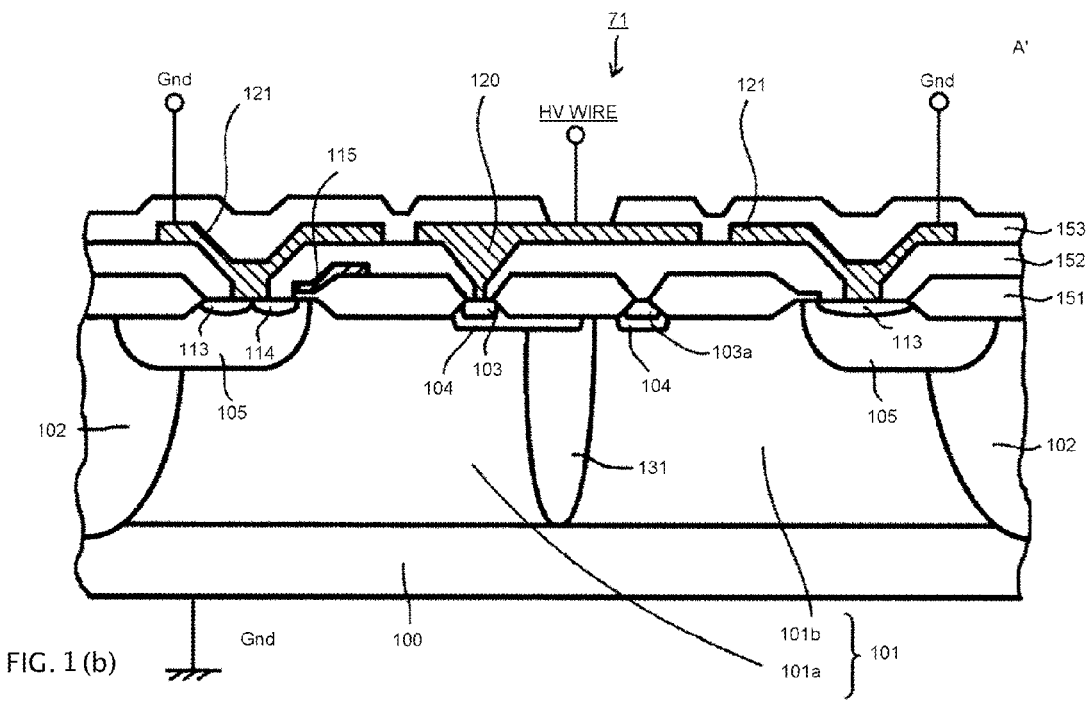
FIGS. 1a-1b are cross-sectional views showing an essential part of a high breakdown voltage MOSFET in accordance with Embodiment 1 of the present invention.

Below, referring to the accompanying drawings, preferred embodiments of a semiconductor device and a driving circuit in accordance with this invention will be described in details. In the description of the drawings, the drawings are schematic ones. The relationship between the thicknesses and planar dimensions of respective layers forming the semiconductor device, the ratios of thicknesses of the respective layers, and the like are different from the real ones. Therefore, the specific thicknesses and dimensions of the respective layers should be judged in consideration of the following description. Further, the respective drawings also include portions different in dimensional relationship and ratio thereamong.

In this specification and the accompanying drawings, a layer or a region prefixed with n or p means that electrons or holes are majority carriers therein, respectively. Further, + and − added to n or p mean that the layers have a higher impurity concentration and a lower impurity concentration than those of the layers not added with them, respectively. Incidentally, in the following description of embodiments and the accompanying drawings, the same configuration is given the same reference numeral, and an overlapping description thereon will be omitted.

Further, in the following embodiments, a description was given by using a silicon (Si) substrate as a semiconductor substrate. However, even when other semiconductor substrates than silicon, such as silicon carbide (SiC) and gallium nitride (GaN) are used, the effects can be obtained similarly.

Embodiment 1

Figure 1B:
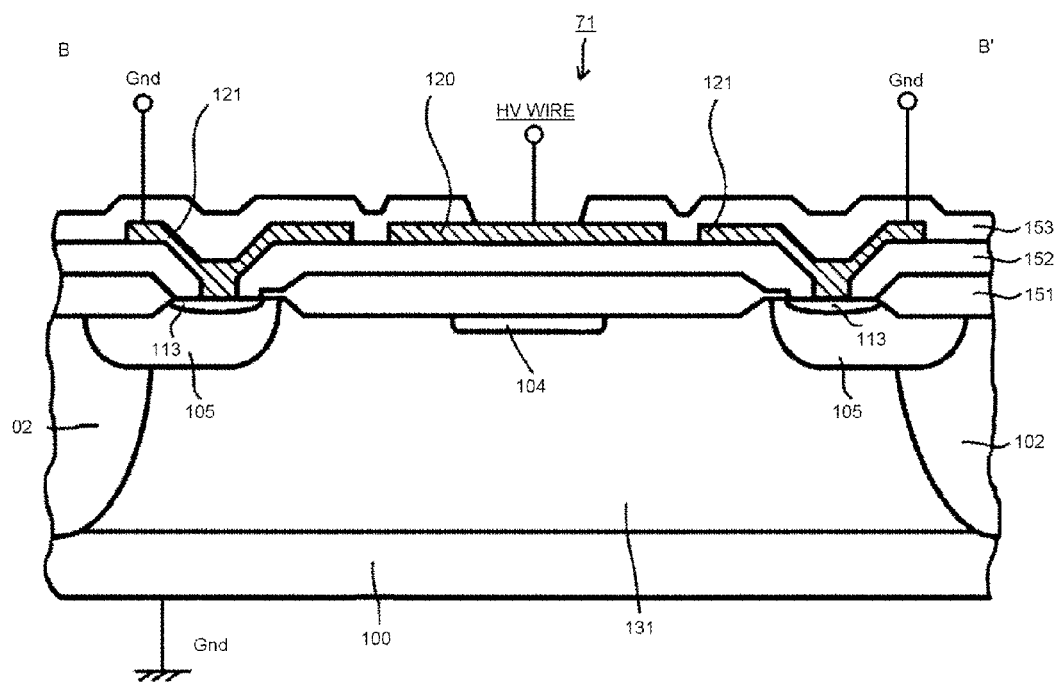
Figure 2:
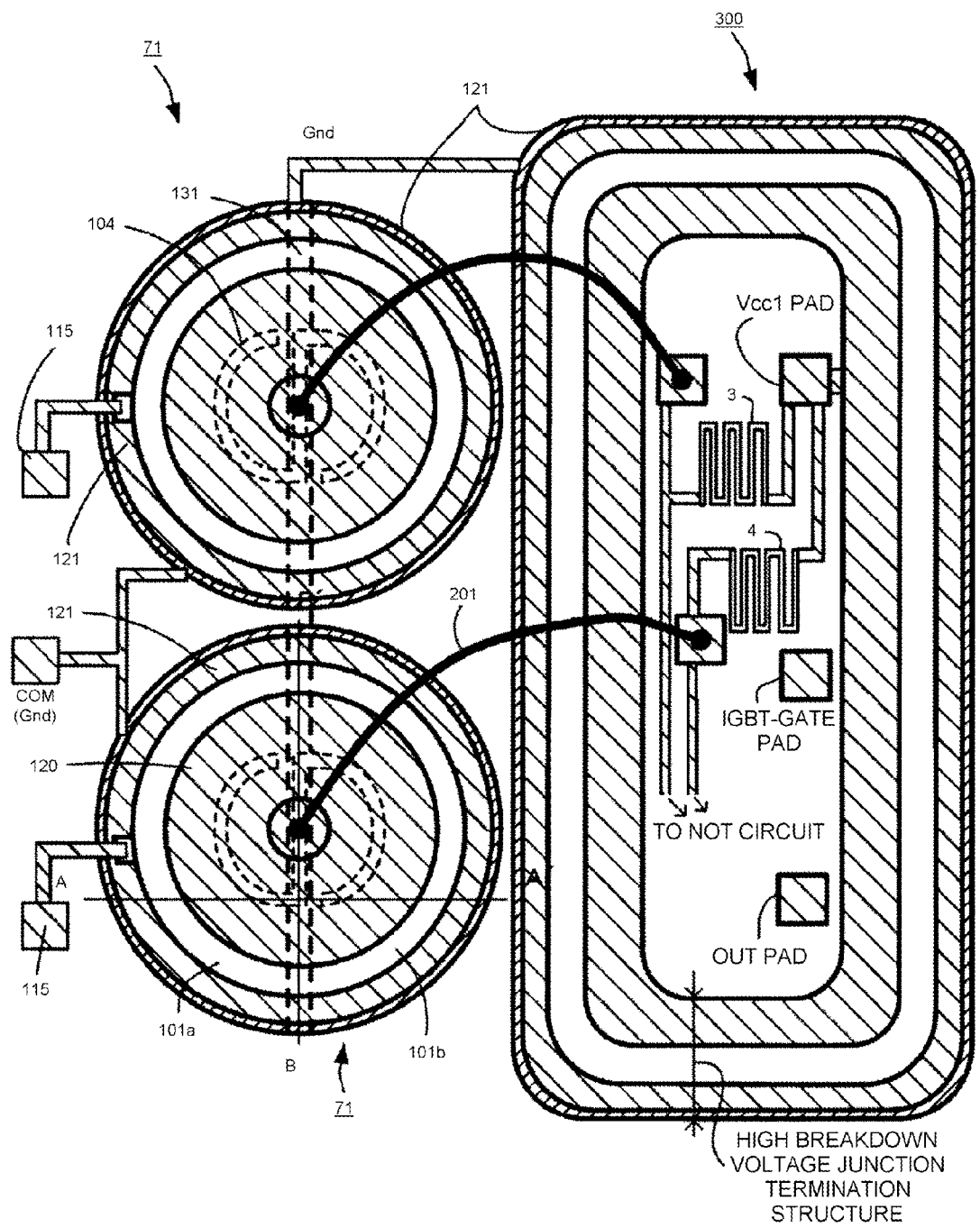
FIG. 2 is a plan view showing an essential part of a high breakdown voltage IC in which a level shift circuit including high breakdown voltage MOSFETs and a driving circuit including a floating potential region are formed in the same semiconductor substrate.

Referring to FIGS. 1 to 3 and FIG. 16, Embodiment 1 will be described. FIG. 1 is a cross-sectional view showing an essential part of a high breakdown voltage MOSFET in accordance with Embodiment 1 of the present invention. Whereas, FIG. 2 is a plan view showing an essential part of a high breakdown voltage IC in which a level shift circuit including high breakdown voltage MOSFETs in accordance with the present invention and a driving circuit including a floating potential region are formed in the same semiconductor substrate. The cross-sectional structure along the cut line A-A' of FIG. 2 corresponds to the cross-sectional view shown in FIG. 1(a). The cross-sectional structure along the cut line B-B' of FIG. 2 corresponds to the cross-sectional view shown in FIG. 1(b).

Figure 3:
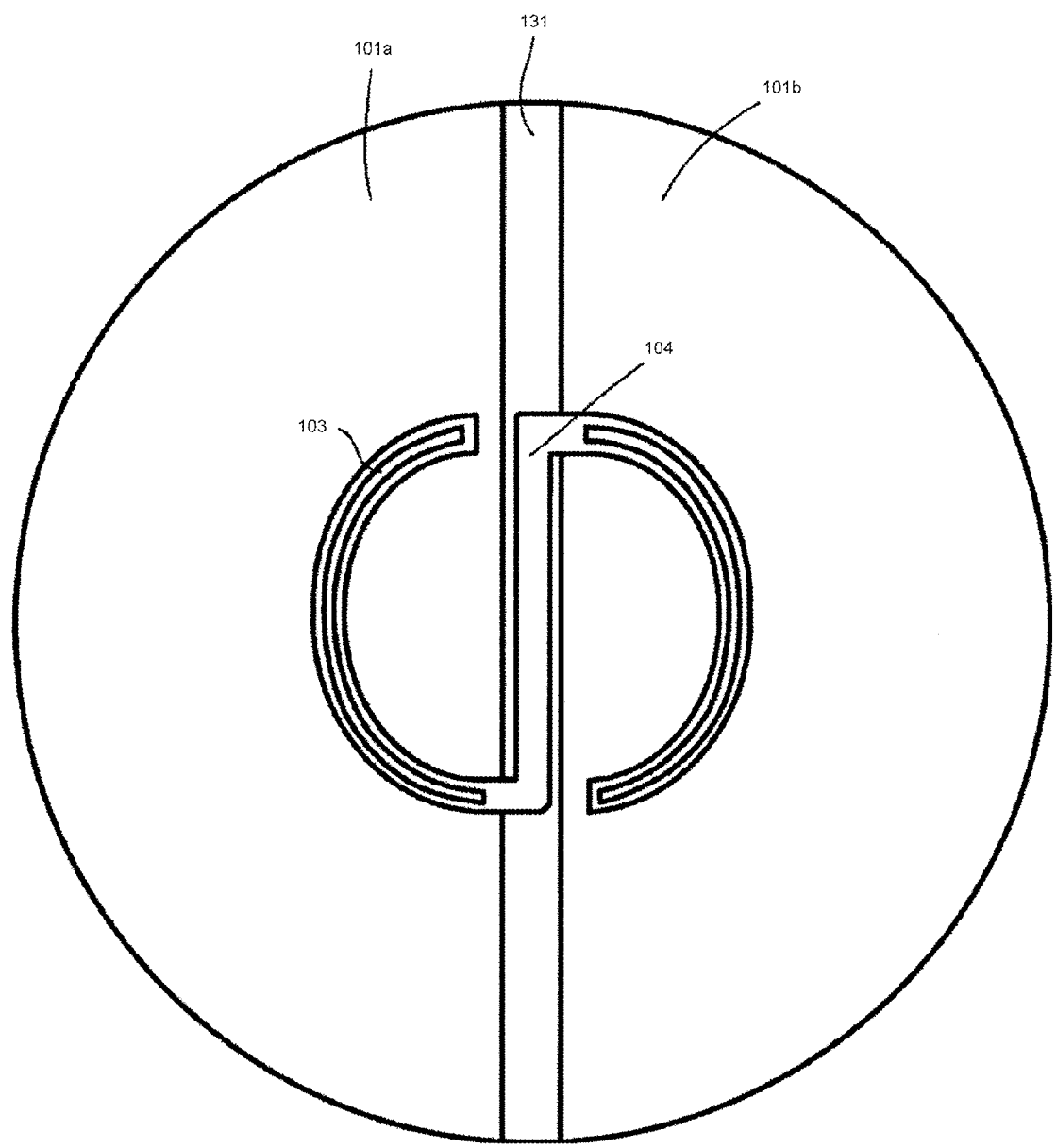
FIG. 3 is a plan view showing a planar layout in the essential part of the high breakdown voltage MOSFET shown in FIG. 2.

Whereas, FIG. 3 is a plan view showing a planar layout in the essential part of the high breakdown voltage MOSFET shown in FIG. 2. FIG. 3 shows only the planar layout of the region exposed at the surface of the n⁻ type region 101 of respective regions forming a high breakdown voltage MOSFET 71. Incidentally, in FIG. 2, only the n offset region 104 and the p⁻ region 131 of semiconductor regions forming the high breakdown voltage MOSFET 71 are indicated with a broken line.

Figure 16:
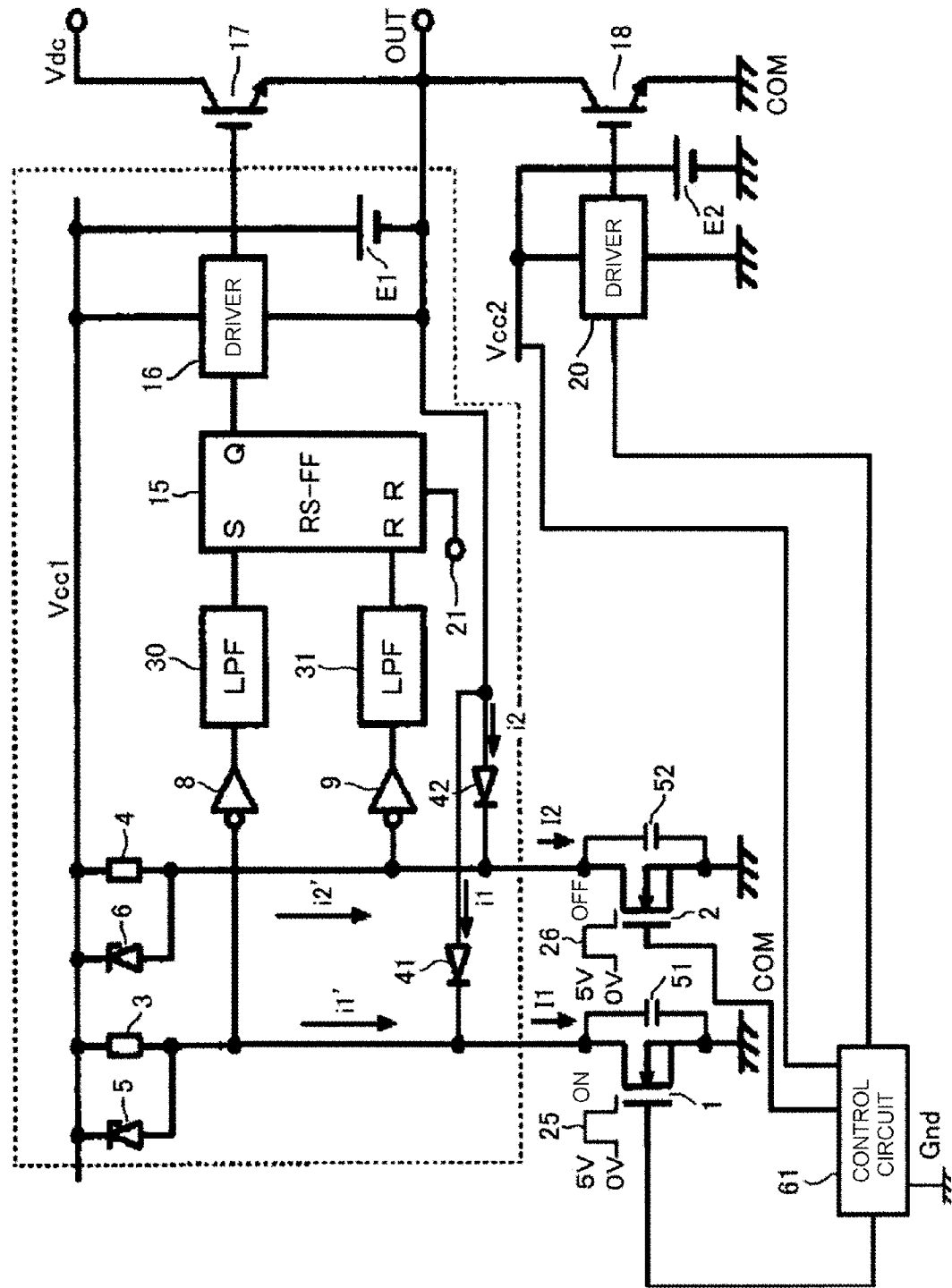
FIG. 16 is a circuit diagram of a high breakdown voltage IC including therein a general level shift circuit.
Figure 17:
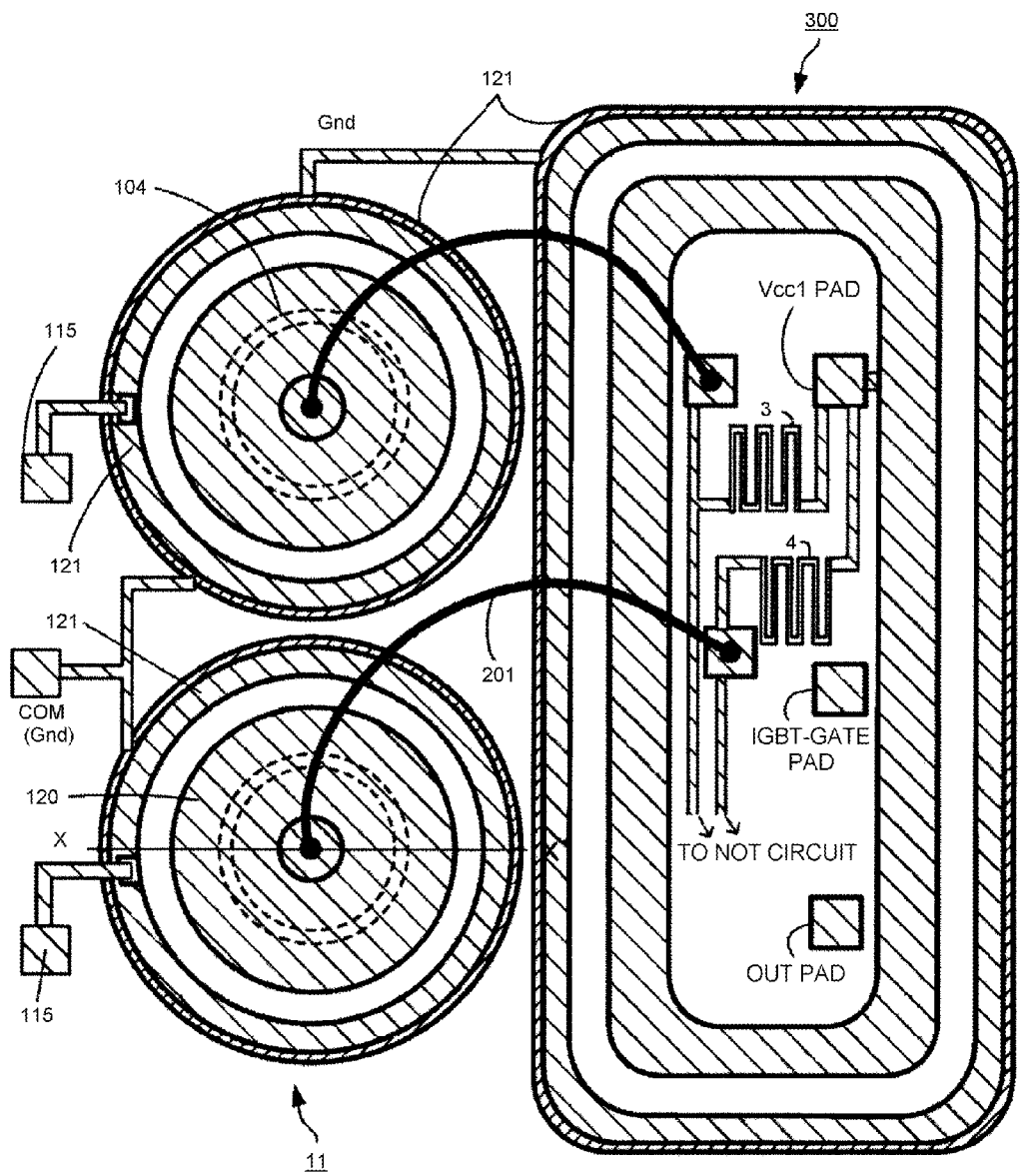
FIG. 17 is a plan view showing an essential part of a high breakdown voltage IC in which a level shift circuit including conventional high breakdown voltage MOSFETs and a driving circuit including a floating potential region are formed in the same semiconductor substrate.
Figure 18:
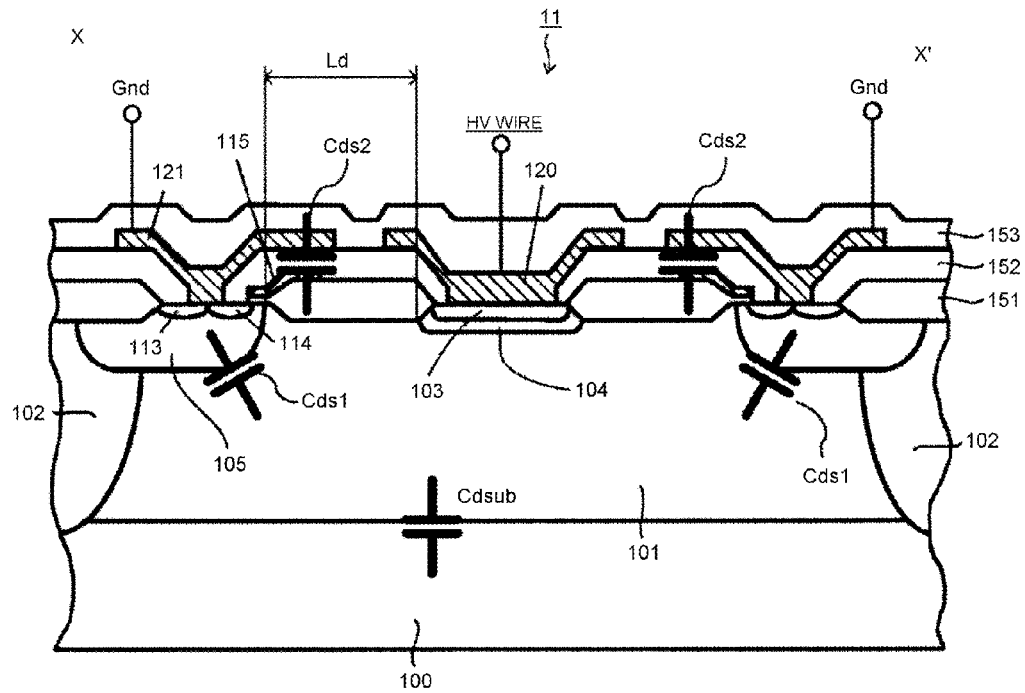
FIGS. 18a-18b are cross-sectional views showing an essential part of the conventional high breakdown voltage MOSFET.
Figure 18:
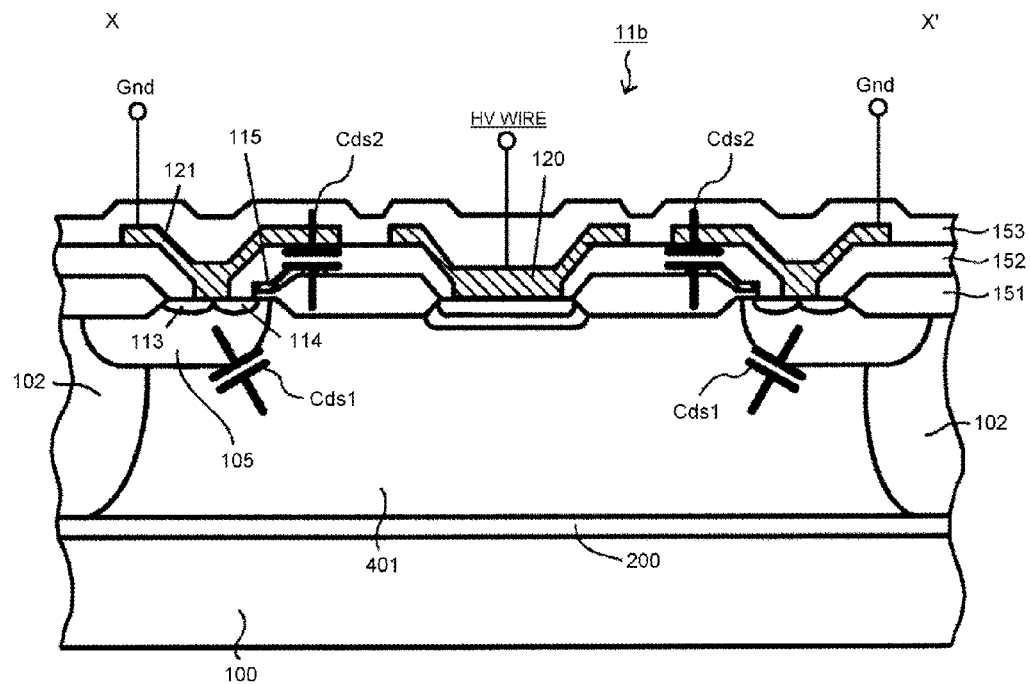

The high breakdown voltage MOSFET 71 of FIG. 1 corresponds to the high breakdown voltage MOSFETs 1 and 2 of FIG. 16. The floating potential region 300 of FIG. 2 corresponds to a region including the circuit portion surrounded by the broken line of FIG. 16 except for the auxiliary DC power source E1, and includes the gate driver of the output switching element (IGBT 17) of the upper arm, and the like. In the floating potential region 300 of FIG. 2, there are shown only the load resistances 3 and 4 of the circuit portion surrounded by the broken line of FIG. 16.

In the floating potential region 300, a Vcc1 pad is a pad for wiring and connecting the floating potential region 300 to the positive electrode side of the auxiliary DC power source E1 of FIG. 16. An IGBT-GATE pad is a pad for wiring and connecting the gate of the IGBT 17 connected between the positive electrode side Vdc of the main DC power source and the AC output terminal OUT of FIG. 16 and the floating potential region 300. An OUT pad is a pad for wiring and connecting the AC output terminal OUT and the negative electrode side of the auxiliary DC power source E1 of FIG. 16 and the floating potential region 300. Further, a high-voltage junction termination structure is formed in such a manner as to surround the floating potential region 300. The high breakdown voltage IC of FIG. 2 is a driving circuit for driving the IGBT 17 of FIG. 16.

The high breakdown voltage MOSFET 71 has the following respective regions. In the surface layer of the p$^-$ type silicon substrate 100, selectively, the n$^-$ type region 101 (breakdown voltage region) is formed. The n$^-$ type region 101 is formed by impurity diffusion. The surface concentration of phosphorus impurities of the n$^-$ type region 101 may be $1\times10^{15}/cm^3$ or more and $1\times10^{16}/cm^3$ or less. The depth Xj of the n$^-$ type region 101 may be 7 μm or more and 10 μm or less.

Further, in the surface layer of the p$^-$ type silicon substrate 100, selectively, the p$^-$ well region 102 (isolation region) is formed. The p$^-$ well region 102 surrounds the peripheral part of the n$^-$ type region 101. The p$^-$ well region 102 is an isolation region from, for example, elements formed outside the p$^-$ well region 102. The p$^-$ well region 102 is connected to the ground Gnd (the common potential COM). The p$^-$ well region 102 has a higher impurity concentration than that of the p$^-$ type silicon substrate 100.

The surface concentration of boron impurities of the p$^-$ well region 102 may be $1\times10^{15}/cm^3$ or more and $1\times10^{18}/cm^3$ or less. The depth Xj of the p$^-$ well region 102 may be 10 μm or more and 13 μm or less. The p$^-$ well region 102 is formed with a depth reaching the p$^-$ type silicon substrate 100.

There is formed a p$^-$ region 131 (first conductivity type semiconductor region) passing through the n$^-$ type region 101, and reaching the p$^-$ type silicon substrate 100. The p$^-$ region 131 isolates the n$^-$ type region 101 into two of an n$^-$ type region 101a (drift region) and an n$^-$ type region 101b (another region). The surface concentration of boron impurities of the p$^-$ region 131 may be $1\times10^{15}/cm^3$ or more and $1\times10^{17}/cm^3$ or less. The depth Xj of the p$^-$ region 131 may be 10 μm or more and 13 μm or less.

A p base region 105 is formed between the p$^-$ well region 102 and the n$^-$ type region 101. The p base region 105 is in contact with the p$^-$ well region 102 and the n$^-$ type region 101. The p base region 105 also functions as a channel region. The surface concentration of boron impurities of the p base region 105 may be $1\times10^{16}/cm^3$ or more and $1\times10^{19}/cm^3$ or less. The depth Xj of the p base region 105 may be 4.0 μm or more and 5.5 μm or less.

In one n$^-$ type region 101a of the n$^-$ type region 101 isolated by the p$^-$ region 131, in the surface area of the p base region 105, selectively, the base pickup p$^+$ region 113 and the source n$^+$ region 114 of the high breakdown voltage MOSFET 71 are formed. For the source n$^+$ region 114 is formed closer to the p$^-$ region 131 than the base pickup p$^+$ region 113. Further, the source n$^+$ region 114 is formed in such a manner as not to be in contact with the p$^-$ region 131.

Whereas, in the surface layer of the n$^-$ type region 101a exposed between the p base region 105 and the p$^-$ region 131, selectively, the drain n$^+$ region 103 of the high breakdown voltage MOSFET 71 is formed. The drain n$^+$ region 103 is formed in such a manner as not to be in contact with the p$^-$ region 131 and the p base region 105. The drain n$^+$ region 103 has a higher impurity concentration than that of the n$^-$ type region 101.

In the surface layer of the other n$^-$ type region 101b of the n$^-$ type region 101 isolated by the p$^-$ region 131, an n$^+$ region 103a is formed. The n$^+$ region 103a is formed symmetrical with the drain n$^+$ region 103 across the p$^-$ region 131. The n$^+$ region 103a is formed apart from the p base region 105 disposed in the n$^-$ type region 101b.

The n offset region 104 surrounds the drain n$^+$ region 103 and the n$^+$ region 103a, and is formed over from the n$^-$ type region 101a to the n$^-$ type region 101b. Namely, the n offset region 104 is in contact with the drain n$^+$ region 103 and the n$^+$ region 103a, and covers the regions under the drain n$^+$ region 103 and the n$^+$ region 103a. The planar shape of the n offset region 104 will be described later. The surface concentration of phosphorus impurities of the n offset region 104 may be $1\times10^{17}/cm^3$ or more and $1\times10^{18}/cm^3$ or less. The depth Xj of the n offset region 104 may be 1 μm or more and 2 μm or less.

On the p base region 105 exposed between the source n$^+$ region 114 and the n$^-$ type region 101a, the gate electrode 115 of the high breakdown voltage MOSFET 71 is formed via a gate oxide film. The gate electrode 115 is formed of, for example, polysilicon. Further, the gate electrode 115 is formed so as not to jut out over the p$^-$ region 131.

The drain electrode 120 (second main electrode) of the high breakdown voltage MOSFET 71 is connected to the drain n$^+$ region 103. Further, the drain electrode 120 is connected to the Vcc1 pad of the floating potential region 300 via a bonding wire 201. The source electrode 121 (first main electrode) of the high breakdown voltage MOSFET 71 is connected to the base pickup p$^+$ region 113 and the source n$^+$ region 114 in the n$^-$ type region 101a, and connected to the base pickup p$^+$ region 113 in the n$^-$ type region 101b. Further, the source electrode 121 is connected to the ground Gnd (the common potential COM).

On the n$^-$ type region 101, there are formed the LOCOS 151 of a field oxide film, the interlayer insulation film 152 of TEOS, BPSG or the like, and the passivation film 153 formed of a silicon oxide film and a silicon nitride film by plasma CVD. The LOCOS 151 covers the n$^-$ type region 101 exposed between the p base region 105 and the n offset region 104, and a portion of the n offset region 104 formed in the p$^-$ region 131. Further, the LOCOS 151 covers the p base region 105 and the p$^-$ well region 102, over from the end on the peripheral part side of the base pickup p$^+$ region 113 to the p$^-$ well region 102.

The interlayer insulation film 152 covers the n$^+$ region 103a. Further, the interlayer insulation film 152 insulates the gate electrode 115, the drain electrode 120, and the source electrode 121 from one another. The passivation film 153 protects the MOS gate structure of the drain n$^+$ region 103, the source n$^+$ region 114, the gate electrode 115, the drain electrode 120, the source electrode 121, and the like of the high breakdown voltage MOSFET 11.

The p$^-$ region 131 is formed in a linear planar shape in such a manner as to pass through the center of the n$^-$ type region 101 forming a circular planar shape, and extends between a part of the p$^-$ well region 102 and another part of the p$^-$ well region 102 opposed to each other across the center of the n$^-$ type region 101. In addition, the p$^-$ region 131 is also formed in contact with the p⁻ type silicon substrate 100 in the depth direction, and isolates the n⁻ type region 101 into two n⁻ type regions 101a and 101b.

The potential of the common potential COM to which the p⁻ well region 102 is connected is the common potential common to the negative electrode side of the main DC power source applied to both ends of the IGBTs 17 and 18 which are output switching elements, the negative electrode side of the auxiliary DC power source E2, the negative electrode side of the driver 20, and the negative electrode sides of the high breakdown voltage MOSFETs 1 and 2, as shown in FIG. 16.

Whereas, the p⁻ region 131 isolating the n⁻ type region 101 into two parts can also be formed simultaneously with the p⁻ well region 102 for reduction of the manufacturing steps. In one n⁻ type region 101a of the two regions isolated by the p⁻ region 131, there are formed the source n⁺ region 114, the drain n⁺ region 103, and the gate electrode 115. To the source n⁺ region 114, the source electrode 121 is connected. To the drain n⁺ region 103, the drain electrode 120 is connected.

Whereas, on the other n⁻ type region 101b of the two regions isolated by the p⁻ region 131, the drain electrode 120 extends and is formed as a field plate via insulation films such as the LOCOS 151 and the interlayer insulation film 152. It may also be configured such that the field plate is formed as a different layer from the drain electrode 120, and is connected to the drain electrode 120. The field plates are formed in the same configuration on the n⁻ type region 101a and on the n⁻ type region 101b.

The formation is performed so that the distance of the end of the field plate on the n⁻ type region 101a side from the end of, the source electrode 121 formed on the n⁻ type region 101a, on the n⁻ type region 101b side is equal to the distance of the end of the field plate on the n⁻ type region 101b side from the end of, the source electrode 121 formed on the n⁻ type region 101b, on the n⁻ type region 101a side. This suppresses the concentration of the electric field to a limited part of the high breakdown voltage MOSFET 71.

Further, as shown in FIG. 3, in the n⁻ type region 101b, the n offset region 104 which is in the n⁻ type region 101a is routed via the p⁻ region 131 to the n⁻ type region 101b to be formed (which will be hereinafter referred to as a routing region of the n offset region 104). Specifically, the portions of the n offset region 104 formed in the n⁻ type region 101a and the n⁻ type region 101b respectively form, for example, circular-arc-shaped planar shapes. Further, the portion of the n offset region 104 formed in the p region 131 forms, for example, a linear planar shape.

One end of the portion of the n offset region 104 formed in the n⁻ type region 101a, and forming the circular-arc-shaped planar shape is connected with one end of the portion thereof formed in the p⁻ region 131, and forming the linear planar shape. One end of the portion of the n offset region 104 formed in the n⁻ type region 101b, and forming the circular-arc-shaped planar shape is connected with the other end of the portion thereof formed in the p⁻ region 131, and forming the linear planar shape. Namely, the n offset region 104 has a generally S-shaped planar shape in which one ends of the portions formed in the n⁻ type region 101a and the n⁻ type region 101b, respectively, and each forming a circular-arc-shaped planar shape are connected with the portion formed in the p⁻ region 131, and forming a linear planar shape.

In the portions of the n offset region 104 formed in the n⁻ type region 101a and the n⁻ type region 101b, and each forming a circular-arc-shaped planar shape, there are formed drain n⁺ regions 103 each forming a circular-arc-shaped planar shape along the planar shape of the n offset region 104, respectively. Thus, provision of the n offset region 104 establishes a connection between the n⁻ type region 101b and the drain n⁺ region 103 in the n⁻ type region 101a with a high resistance of about several kΩ to several tens kΩ. Namely, the routing region of the n offset region 104 becomes a high resistance element.

In order not to affect the breakdown voltage characteristics of the high breakdown voltage MOSFET 71, the routing region (high resistance element) of the n offset region 104 is preferably not disposed outside the metal field plate formed of the drain electrode 120 (i.e., on the source n⁺ region 114 side). Alternatively, the n⁺ region 103a is not required to be formed. When the n⁺ region 103a is not formed, the surface of the n offset region 104 in the n⁻ type region 101b is covered with the LOCOS 151. Further, when the n⁺ region 103a is not formed, it is essential only that the n offset region 104 is in contact with the n⁻ type region 101b.

Further, as shown in FIG. 3, in consideration of the balance in breakdown voltage between the n⁻ type region 101a and the n⁻ type region 101b, the n offset region 104 formed in the n⁻ type region 101a and the n offset region 104 formed in the n⁻ type region 101b are formed so as to be symmetrical with each other across the p⁻ region 131.

Further, desirably, the p base region 105 and the p⁻ well region 102 at the outermost periphery of the high breakdown voltage MOSFET 71 circular in planar shape are continuously connected to each other. The p base region 105 and the p⁻ well region 102 are connected to the ground Gnd which is the common potential COM. Without forming the p base region 105, the p⁻ well region 102 may be used as the p base region 105. Further, the p⁻ type silicon substrate 100 is connected to the p⁻ well region 102, thereby to be connected to the ground Gnd (the common potential COM).

The following is acceptable: on the back surface of the p⁻ type silicon substrate 100, an electrode (not shown) is formed, and the electrode formed on the back surface of the p⁻ type silicon substrate 100 is connected to the ground Gnd. In the present Embodiment 1, a description is given by taking the following case as an example: the n⁻ type region 101 is selectively formed in the surface layer of the p⁻ type silicon substrate 100 by impurity diffusion; and the p⁻ well region 102 is formed in such a manner as to surround the n⁻ type region 101 by impurity diffusion.

Then, the relationship between the high-resistance n offset region 104 connecting the drain n⁺ region 103 and the n⁻ type region 101b in the high breakdown voltage MOSFET 71, and the cut-off frequency will be described below. The high breakdown voltage MOSFET 71 is used as, for example, a level shift element for exchanging signals between the high-side driving circuit and the low-voltage circuit region of the high breakdown voltage IC (HVIC: High Voltage Gate Driver IC) shown in FIG. 2.

Alternatively, as other application fields than the level shift element, in the case of the power source field such as the driver IC of a liquid crystal panel, the high breakdown voltage MOSFET 71 is used in a high breakdown voltage IC with an oscillation frequency of from about 100 kHz to 500 kHz in switching frequency.

On the other hand, the parasitic output capacitance (=Cds+Cdsub) of the n⁻ type region 101 when the drain terminal of the high breakdown voltage MOSFET 71 is applied with a voltage is set at about 2 pF. As a result, the parasitic output capacitance of the n⁻ type region 101b becomes about 1 pF which is about half of that of the n⁻ type region 101.

In this case, the CR cut-off frequency where C denotes the parasitic capacitance of the n⁻ type region 101b, and R denotes the resistance value of the n offset region 104 between the drain n⁺ region 103 and the n⁻ type region 101b, namely, the switching operation frequency fc of the high breakdown voltage semiconductor device (high breakdown voltage MOSFET) is expressed as the following equation.
[Eq. 2]

$$fc=1/(2\pi C \cdot R) \qquad (2)$$

where

R: resistance value (Ω) of the high resistance element,

C: output capacitance (F) of the high breakdown voltage semiconductor device, and fc: switching operation frequency (Hz) of the high breakdown voltage semiconductor device.

In order to reduce the signal transfer delay due to the parasitic capacitance of the high breakdown voltage MOSFET in, for example, a switching frequency of 100 kHz, it is essential only that the parasitic capacitance of the $n^-$ type region 101b can be nullified during respective periods of the rise time or the fall time which is the switching period for switching the high breakdown voltage MOSFET.

When conversion into the switching frequency is performed with the rise time and the fall time of the high breakdown voltage MOSFET respectively set at about 10 ns, the switching operation frequency fc of the high breakdown voltage MOSFET becomes 100 MHz. As a result, from the equation (2), the resistance value R between the drain $n^+$ region 103 of the n offset region 104 and the $n^-$ type region 101b becomes:

$$R=1/(2\pi \times 10^{-12} \times 100 \times 10^6)=1.6 \text{ k}\Omega.$$

Therefore, in order to reduce the signal transfer delay due to the parasitic capacitance of the high breakdown voltage MOSFET at a switching frequency of 100 kHz, it is essential only that the resistance value R is set at 1.6 kΩ or more. In this case, when the sheet resistance value of the routing region of the n offset region 104 with a width set at, for example, 4 μm is assumed to be 0.8 kΩ/(kiloohm/square), it is desirably possible to ensure that the length of the routing region of the n offset region 104 formed in the surface layer of the $p^-$ region 131 is about 8 μm. For this reason, it is indicated that the resistance value R of the n offset region 104 calculated by the equation (2) is a value which offers no problem in terms of layout dimensions, and is realistic.

As described up to this point, in accordance with Embodiment 1, the high-resistance n offset region 104 is disposed between the drain $n^+$ region 103 and the $n^-$ type region 101b of the high breakdown voltage MOSFET 71. As a result, it is possible to reduce the parasitic capacitance by about 40% to about 50% than the output capacitance of the conventional high breakdown voltage MOSFET. The reason for this is as follows.

In the high breakdown voltage MOSFET 71, the $p^-$region 131 isolates the $n^-$ type region 101 into the $n^-$ type region 101a and the $n^-$ type region 101b. The $n^-$ type region 101b is connected to the drain $n^+$ region 103 through the routing region of the n offset region 104 formed of a diffused resistor relative to the $n^-$ type region 101a. As a result, the $n^-$ type region 101b portion functions as a low-pass filter, and does not become an output capacitance component for from the drain terminal to the source terminal. For this reason, it is possible to reduce the source-drain capacitance Cds and the substrate-drain capacitance Cdsub according to the PN junction area of the $n^-$ type region 101b with the p base region 105, the $p^-$ well region 102, and the $p^-$ type silicon substrate 100.

Herein, in the high breakdown voltage MOSFET 71 of the present invention, the isolation of the $n^-$ type region 101 by the $p^-$ region 131 results in reduction of the effective channel width functioning as a MOSFET. This causes a concern about the reduction of the ON current relative to a conventional high breakdown voltage MOSFET. The reduction of the ON current of the high breakdown voltage MOSFET 71 can be avoided by, for example, adopting the following configuration.

By variously changing the surface concentration of impurities in the p base region 105 which is a channel region, or the channel length (the distance between the source $n^+$ region 114 and the $n^-$ type region 101a), it is possible to adjust the current driving ability with ease. For this reason, the surface concentration of impurities in the p base region 105 is reduced as much as the reduction of the effective channel width in the high breakdown voltage MOSFET 71, thereby to set the Vth (threshold value) voltage low. As a result, it is possible to obtain a desirable drain saturation current.

In the description up to this point, a description was given to the case where the $n^-$ type region 101 was formed by diffusion of impurities. However, the $n^-$ type region 101 may be formed on the $p^-$ type silicon substrate 100 by epitaxial growth. In this case, the impurity concentration of the $n^-$ type region 101 may be set at $1 \times 10^{14}/\text{cm}^3$ or more to $1 \times 10^{16}/\text{cm}^3$. Also in the following respective embodiments, the same effects can also be similarly obtained in the case where the $n^-$ type region 101 formed of the diffusion region is replaced with an epitaxial region formed by epitaxial growth.

Figure 4:
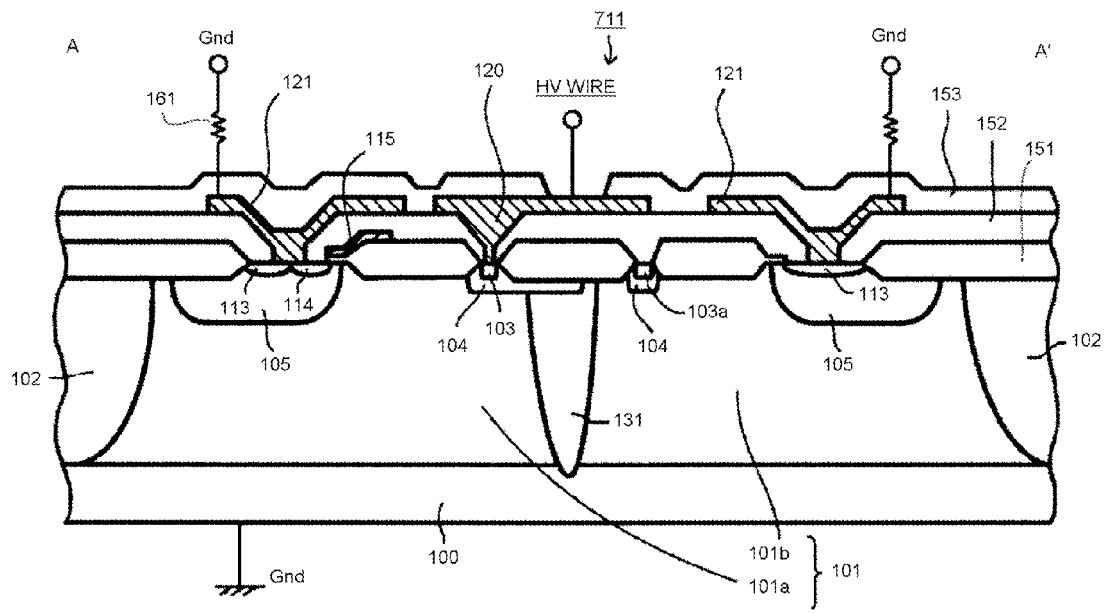
FIG. 4 is a cross-sectional view showing another example of the cross-sectional structure along a cut line A-A' of FIG. 2.
Figure 5:
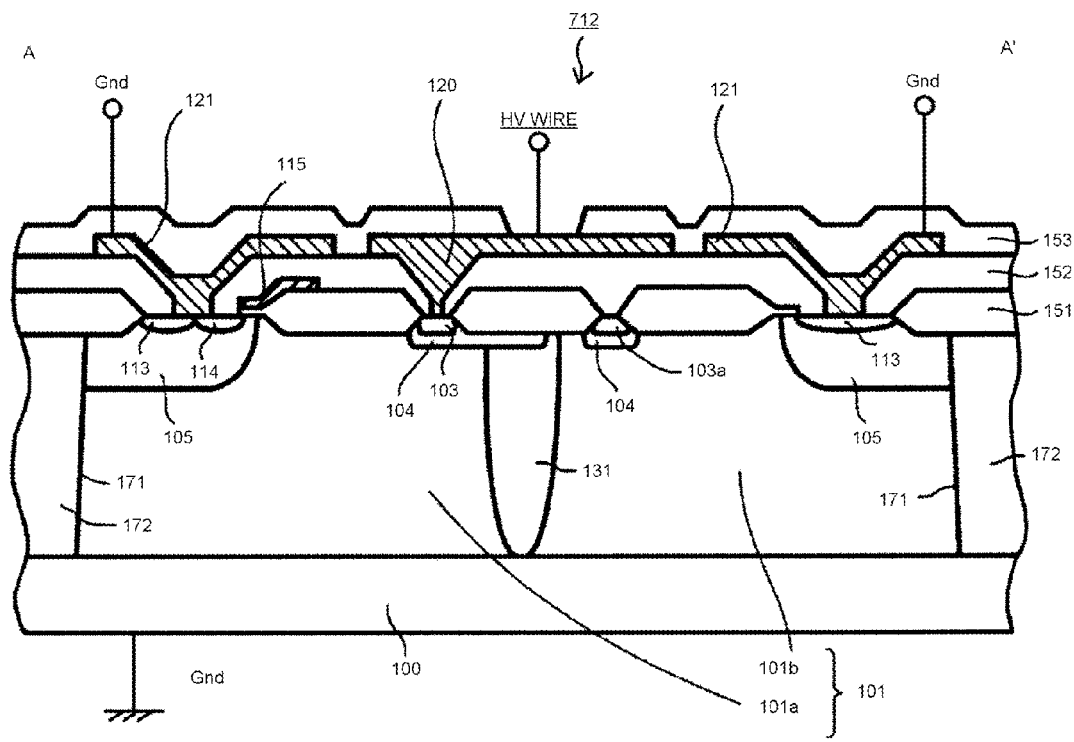
FIG. 5 is a cross-sectional view showing a still other example of the cross-sectional structure along the cut line A-A' of FIG. 2.

Further, modified examples of the high breakdown voltage MOSFET 71 in accordance with Embodiment 1 are shown in FIGS. 4 and 5. FIGS. 4 and 5 are cross-sectional views showing other examples of the cross-sectional structure along the cut line A-A' of FIG. 2. As with the high breakdown voltage MOSFET 711 shown in FIG. 4, there may be disposed a load resistance element 161 between the source electrode 121 and the ground Gnd (the common potential COM). In the case of the high breakdown voltage MOSFET 711 shown in FIG. 4, the p base region 105 and the $p^-$ well region 102 are disposed apart from each other. The $p^-$ type silicon substrate 100 with which the $p^-$ well region 102 is in contact is set at the ground potential.

Further, as with a high breakdown voltage MOSFET 712 shown in FIG. 5, it may be configured such that, in place of the $p^-$ well region 102 shown in the high breakdown voltage MOSFET 71 of FIG. 1, the isolation region is formed of a trench 171 formed from the surface of the $p^-$ type silicon substrate 100, and a silicon oxide film 172 filling the trench 171. The high breakdown voltage MOSFETs 711 and 712 shown in FIGS. 4 and 5 can also provide the same effects as those with the high breakdown voltage MOSFET 71 of FIG. 1.

Further, herein, a description was given to the case where the high breakdown voltage MOSFETs 71, 711, and 712 were Nch MOSFETs. However, a Pcn MOSFET can also be implemented only by reversing the polarities of the n type and the p type. The Nch MOSFET is not exclusive. The following respective embodiments are also applicable to either of the n type MOSFET and the p type MOSFET as with Embodiment 1.

Embodiment 2

Figure 6:
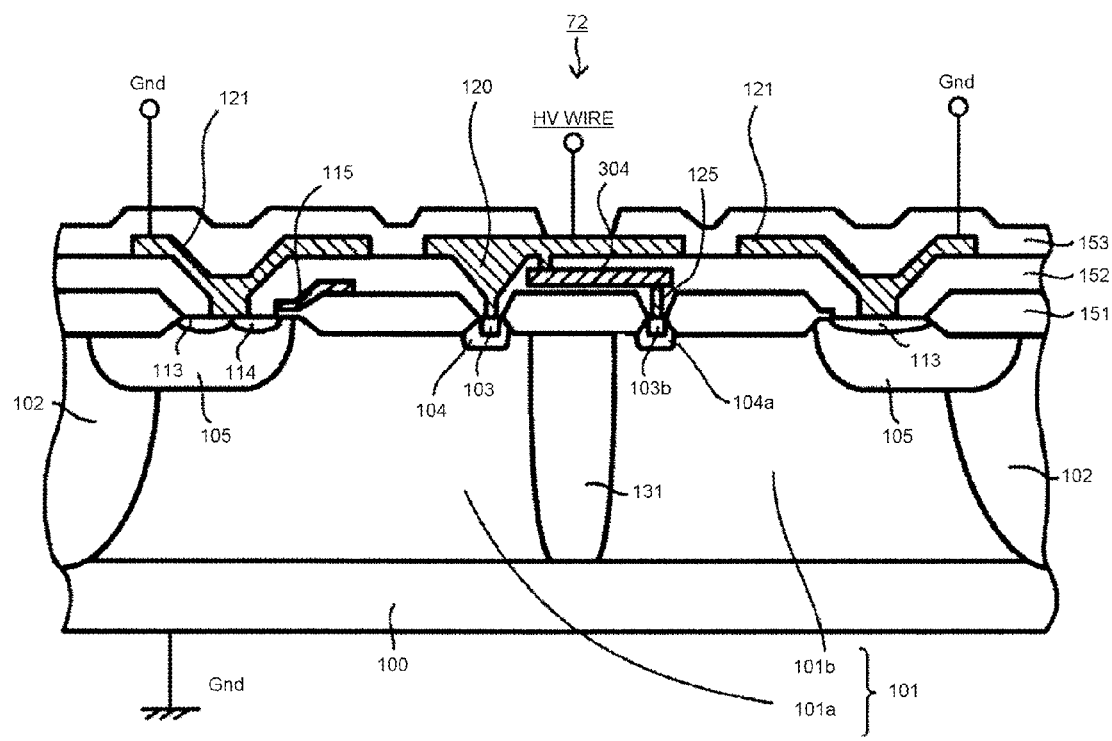
FIG. 6 is a cross-sectional view showing an essential part of a high breakdown voltage MOSFET in accordance with Embodiment 2 of the present invention.
Figure 7:
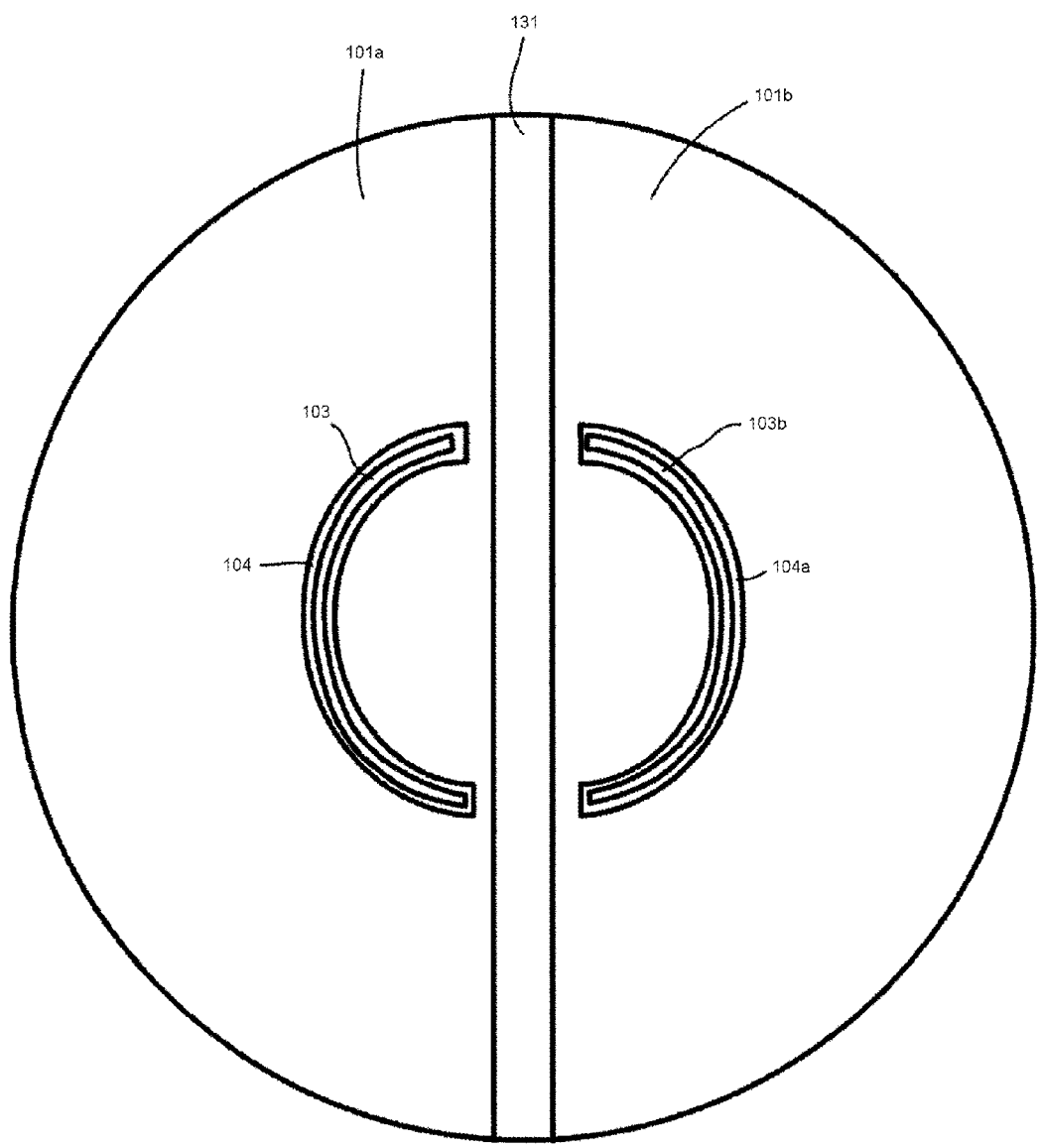
FIG. 7 is a plan view showing a planar layout in the essential part of the high breakdown voltage MOSFET shown in FIG. 6.

Referring to FIGS. 6 and 7, a description will be given to a high breakdown voltage MOSFET in accordance with Embodiment 2. FIG. 6 is a cross-sectional view showing an essential part of the high breakdown voltage MOSFET in accordance with Embodiment 2 of the present invention. FIG. 7 is a plan view showing a planar layout in the essential part of the high breakdown voltage MOSFET shown in FIG. 6. FIG. 7 shows only the planar layout of the region exposed at the surface of the n⁻ type region 101 of respective regions forming a high breakdown voltage MOSFET 72. The high breakdown voltage MOSFET 72 of FIG. 6 corresponds to the high breakdown voltage MOSFET 1 or 2 of FIG. 16.

The high breakdown voltage MOSFET 72 has the following respective regions. In the surface layer of the p⁻type silicon substrate 100, selectively, the n⁻ type region 101 is formed. The n⁻ type region 101 is formed by impurity diffusion. The surface concentration of phosphorus impurities of the n⁻ type region 101 may be $1 \times 10^{15}/cm^3$ or more and $1 \times 10^{16}/cm^3$ or less. The depth Xj of the n⁻ type region 101 may be 7 µm or more and 10 µm or less.

Further, in the surface layer of the p⁻ type silicon substrate 100, selectively, the p⁻ well region 102 is formed. The p⁻ well region 102 surrounds the peripheral part of the n⁻ type region 101. The p⁻ well region 102 is an isolation region from, for example, elements formed outside the p⁻ well region 102. The p⁻ well region 102 is connected to the ground Gnd (the common potential COM). The p⁻ well region 102 has a higher impurity concentration than that of the p⁻ type silicon substrate 100.

The surface concentration of boron impurities of the p⁻ well region 102 may be $1 \times 10^{15}/cm^3$ or more and $1 \times 10^{18}/cm^3$ or less. The depth Xj of the p⁻ well region 102 may be 10 µm or more and 13 µm or less. The p⁻ well region 102 is formed with a depth reaching the p⁻ type silicon substrate 100.

There is formed a p⁻ region 131 passing through the n⁻ type region 101, and reaching the p⁻ type silicon substrate 100. The p⁻ region 131 isolates the n⁻ type region 101 into two n⁻ type regions 101a and 101b. The surface concentration of boron impurities of the p⁻ region 131 may be $1 \times 10^{15}/cm^3$ or more and $1 \times 10^{17}/cm^3$ or less. The depth Xj of the p⁻ region 131 may be 10 µm or more and 13 µm or less. On the n⁻ type region 101, a polysilicon 304 is formed. The polysilicon 304 electrically connects the n⁻ type region 101a and the n⁻ type region 101b. Further, the polysilicon 304 has a lower impurity concentration than that of the n⁻ type region 101a.

A p base region 105 is formed between the p⁻ well region 102 and the n⁻ type region 101. The p base region 105 is in contact with the p⁻ well region 102 and the n⁻ type region 101. The p base region 105 also functions as a channel region. The surface concentration of boron impurities of the p base region 105 may be $1 \times 10^{16}/cm^3$ or more and $1 \times 10^{19}/cm^3$ or less. The depth Xj of the p base region 105 may be 4.0 µm or more and 5.5 µm or less.

In one n⁻ type region 101a of the n⁻ type region 101 isolated by the p⁻ region 131, in the surface area of the p base region 105, selectively, the base pickup p⁺ region 113 and the source n⁺ region 114 of the high breakdown voltage MOSFET 72 are formed. For the source n⁺ region 114 is formed closer to the p⁻ region 131 than the base pickup p⁺ region 113. Further, the source n⁺ region 114 is formed in such a manner as not to be in contact with the p⁻ region 131.

Whereas, in the surface layer of the n⁻ type region 101a exposed between the p base region 105 and the p⁻ region 131, selectively, the drain n⁺ region 103 of the high breakdown voltage MOSFET 72 is formed. The drain n⁺ region 103 is formed in such a manner as not to be in contact with the p⁻ region 131 and the p base region 105. The drain n⁺ region 103 has a higher impurity concentration than that of the n⁻ type region 101.

In the surface layer of the other n⁻ type region 101b of the n⁻ type region 101 isolated by the p⁻ region 131, an n⁺ region 103b is formed. The n⁺ region 103b is formed symmetrical with the drain n⁺ region 103 across the p⁻ region 131. The n⁺ region 103b is formed apart from the p base region 105 disposed in the n⁻ type region 101b.

The n offset region 104 is selectively formed in the surface layer of the n⁻ type region 101a, and surrounds the drain n⁺ region 103. Namely, the n offset region 104 is in contact with the drain n⁺ region 103, and covers the region under the drain n⁺ region 103. The n offset region 104 is formed apart from the p⁻ region 131.

Further, the n offset region 104 has a circular-arc-shaped planar shape based on the center of the n⁻ type region 101 forming, for example, a circular planar shape. The surface concentration of phosphorus impurities of the n offset region 104 may be $1 \times 10^{17}/cm^3$ or more and $1 \times 10^{18}/cm^3$ or less. The depth Xj of the n offset region 104 may be 1 µm or more and 2 µm or less.

The n offset region 104a is selectively formed in the surface layer of the n⁻ type region 101b, and surrounds the n⁺ region 103b. Namely, the n offset region 104a is in contact with the drain n⁺ region 103b, and covers the region under the drain n⁺ region 103b. The n offset region 104a is formed apart from the p⁻ region 131.

Further, the n offset region 104a has a circular-arc-shaped planar shape based on the center of the n⁻ type region 101 having, for example, a circular planar shape. The n offset region 104a is formed symmetrically with the n offset region 104, for example, across the p⁻ region 131. The surface concentration of phosphorus impurities of the n offset region 104a may be $1 \times 10^{17}/cm^3$ or more and $1 \times 10^{18}/cm^3$ or less. The depth Xj of the n offset region 104a may be 1 µm or more and 2 µm or less.

On the p base region 105 exposed between the source n⁺ region 114 and the n⁻ type region 101a, the gate electrode 115 of the high breakdown voltage MOSFET 72 is formed via a gate oxide film. The gate electrode 115 is formed of, for example, polysilicon. The gate electrode 115 is formed so as not to jut out over the p⁻ region 131.

The drain electrode 120 of the high breakdown voltage MOSFET 72 is connected to the drain n⁺ region 103. Further, the drain electrode 120 is connected to the Vcc1 pad of the floating potential region via a bonding wire (not shown). A polysilicon 304 is connected to the drain electrode 120. The polysilicon 304 is a high resistance element for electrically connecting the drain n⁺ region 103 and the n⁻ type region 101b. A connection electrode 125 connects the polysilicon 304 and the n⁺ region 103b. Namely, the polysilicon 304 is connected to the n⁻ type region 101b via the connection electrode 125, the n⁺ region 103b, and the n offset region 104a.

The source electrode 121 of the high breakdown voltage MOSFET 72 is connected to the base pickup p⁺ region 113 and the source n⁺ region 114 in the n⁻ type region 101a, and connected to the base pickup p⁺ region 113 in the n⁻ type region 101b. Further, the source electrode 121 is connected to the ground Gnd (the common potential COM).

On the n⁻ type region 101, there are formed the LOCOS 151 of a field oxide film, the interlayer insulation film (silicon oxide film) 152 of TEOS, BPSG or the like, and the passivation film 153 formed of a silicon oxide film and a silicon nitride film by plasma CVD. The LOCOS 151 covers the n⁻ type region 101a exposed between the p base region 105 and the n offset region 104, and the n⁻ type region 101b exposed between the p base region 105 and the n offset region 104a. Further, the LOCOS 151 covers the p base region 105 and the p⁻ well region 102, over from the end of the base pickup p⁺ region 113 on the substrate outer peripheral part side to the p⁻ well region 102.

The interlayer insulation film 152 insulates the gate electrode 115, the drain electrode 120, and the source electrode 121 from one another. The passivation film 153 protects the MOS gate structure of the drain n⁺ region 103, the source n⁺ region 114, the gate electrode 115, the drain electrode 120, the source electrode 121, and the like of the high breakdown voltage MOSFET 11.

The p⁻ region 131 is formed in a linear planar shape in such a manner as to pass through the center of the n⁻ type region 101 forming a circular planar shape, and extends between a part of the p⁻ well region 102 and another part of the p⁻ well region 102 opposed to each other across the center of the n⁻ type region 101. In addition, the p⁻ region 131 is also formed in contact with the p⁻ type silicon substrate 100 in the depth direction, and isolates the n⁻ type region 101 into two n⁻ type regions 101a and 101b.

The potential of the common potential COM to which the p⁻ well region 102 is connected is the common potential common to the negative electrode side of the main DC power source applied to both ends of the IGBTs 17 and 18 which are output switching elements, the negative electrode side of the auxiliary DC power source E2, the negative electrode side of the driver 20, and the negative electrode sides of the high breakdown voltage MOSFETs 1 and 2, as shown in FIG. 16.

Whereas, the p⁻ region 131 isolating the n⁻ type region 101 into two parts can also be formed simultaneously with the p⁻ well region 102 for reduction of the manufacturing steps. In one n⁻ type region 101a of the two regions isolated by the p⁻ region 131, there are formed the source n⁺ region 114, the drain n⁺ region 103, and the gate electrode 115. To the source n⁺ region 114, the source electrode 121 is connected. To the drain n⁺ region 103, the drain electrode 120 is connected.

Whereas, on the other n⁻ type region 101b of the two regions isolated by the p⁻ region 131, the drain electrode 120 extends and is formed as a field plate via insulation films such as the LOCOS 151 and the interlayer insulation film 152. It may be also configured such that the field plate is formed as a different layer from the drain electrode 120, and is connected to the drain electrode 120. The field plates are formed in the same configuration on the n⁻ type region 101a and on the n⁻ type region 101b.

The formation is performed so that the distance of the end of the field plate on the n⁻ type region 101a side from the end of, the source electrode 121 formed on the n⁻ type region 101a, on the n⁻ type region 101b side is equal to the distance of the end of the field plate on the n⁻ type region 101b side from the end of, the source electrode 121 formed on the n⁻ type region 101b, on the n⁻ type region 101a side. This suppresses the concentration of the electric field to a limited part of the high breakdown voltage MOSFET 72.

Further, in the n⁻ type region 101b, as with the n⁺ region 103 and the n offset region 104 formed in the n⁻ type region 101a, the n⁺ region 103b and the n offset region 104a are disposed. The n⁺ region 103b and the n offset region 104a are not in direct contact with the drain electrode 120. Between the drain electrode 120 and the n⁺ region 103b, there is disposed a polysilicon 304 which is a high resistance element (about several k to several tens kΩ).

In order not to affect the breakdown voltage characteristics of the high breakdown voltage MOSFET 72, the polysilicon 304 which is a high resistance element and the n offset region 104a are preferably not disposed outside the metal field plate formed of the drain electrode 120 (i.e., on the source n⁺ region 114 side). Whereas, for the polysilicon 304 of the high breakdown voltage MOSFET 72, there is used a polysilicon for a high resistance element deposited in a different step from that for the polysilicon to be used for the gate electrode 115. The planar shape of the polysilicon 304 may be a thin rectangular shape or a spiral shape, and has no particular restriction so long as the polysilicon 304 is formed in the region under the drain electrode 120.

Whereas, the connection electrode 125 is in ohmic contact with the n⁺ region 103b and polysilicon 304. For the n offset region 104a, in consideration of the balance in breakdown voltage between the n⁻ type region 101a and the n⁻ type region 101b, the n offset region 104 formed in the n⁻ type region 101a and the n offset region 104a formed in the n⁻ type region 101b are formed so as to be symmetrical with each other across the p⁻ region 131.

Alternatively, any one or both of the n⁺ region 103b and the n offset region 104a may be not formed. In this case, the contact between the connection electrode 125 and the n⁻ type region 101b forms a Schottky junction. Therefore, it is necessary to perform the formation in consideration of the effects by the Schottky junction.

Further, desirably, the p base region 105 and the p⁻ well region 102 at the outermost periphery of the high breakdown voltage MOSFET 72 circular in planar shape are continuously connected to each other. The p base region 105 and the p⁻ well region 102 are connected to the ground Gnd which is the common potential COM. The p⁻ well region 102 and the p base region 105 may be formed as one region. Further, the p⁻ type silicon substrate 100 is connected to the p⁻ well region 102, thereby to be connected to the ground Gnd (the common potential COM).

The following is acceptable: on the back surface of the p⁻ type silicon substrate 100, an electrode (not shown) is formed, and the electrode formed on the back surface of the p⁻ type silicon substrate 100 is connected to the ground Gnd. In the present Embodiment 2, a description is given by taking the following case as an example: the n⁻ type region 101 is selectively formed in the surface layer of the p⁻ type silicon substrate 100 by impurity diffusion; and the p⁻ well region 102 is formed in such a manner as to surround the n⁻ type region 101 by impurity diffusion. Herein, there can be considered the case where the p⁻ well region 102 is not formed. In the case where the p⁻ well region 102 is not formed, the p⁻ type silicon substrate 100 becomes an isolation region.

The high breakdown voltage MOSFET 72 is formed in the foregoing structure. As a result, when the drain electrode 120 is applied with a high voltage (e.g., 600 V), there are fully depleted all of the n⁻ type region 101a, the n⁻ type region 101b, and the p⁻ region 131, which are breakdown voltage regions interposed between the metal field plate formed of the source electrode 121 and the metal field plate formed of the drain electrode 120. For this reason, the breakdown voltage characteristics of the high breakdown voltage MOSFET 72 are not affected.

Further, in order to reduce the signal transfer delay due to the parasitic capacitance of the high breakdown voltage MOSFET in, for example, a switching frequency of 100 kHz, it is essential only that the parasitic capacitance of the n⁻ type region 101b can be nullified during respective periods of the rise time or the fall time of the high breakdown voltage MOSFET.

When conversion into the switching frequency is performed with the rise time and the fall time of the high breakdown voltage MOSFET respectively set at about 10 ns, the switching operation frequency fc of the high breakdown voltage MOSFET becomes 100 MHz. As a result, from the equation (2), the resistance value R of the high-resistance polysilicon 304 connecting the drain electrode 120 and the n⁻ type region 101b becomes:

$$R = 1/(2\pi \times 10^{-12} \times 100 \times 10^6) = 1.6 \text{ k}\Omega.$$

Therefore, in order to reduce the signal transfer delay due to the parasitic capacitance of the high breakdown voltage MOSFET at a switching frequency of 100 kHz, it is essential only that the resistance value R is set at 1.6 kΩ or more. In this case, when the sheet resistance value of the high-resistance polysilicon 304 with a width set at, for example, 4 μm is assumed to be 0.8 kΩ/, it is desirably possible to ensure that the length of the polysilicon 304 disposed on the p⁻ region 131 or on the n⁻ type region 101 is about 8 μm. For this reason, it is indicated that the resistance value R of the polysilicon 304 calculated by the equation (2) is a value which offers no problem in terms of layout dimensions, and is realistic.

As described up to this point, in accordance with Embodiment 2, the high-resistance polysilicon 304 is disposed between the n⁻ type region 101a and the n⁻ type region 101b of the high breakdown voltage MOSFET 72. As a result, it is possible to reduce the parasitic capacitance by about 40% to about 50% than the output capacitance of the conventional high breakdown voltage MOSFET. Namely, the high breakdown voltage MOSFET 72 in accordance with Embodiment 2 can provide the same effects as with the high breakdown voltage MOSFET in accordance with Embodiment 1. The reason for this is as follows.

In the high breakdown voltage MOSFET 72, the p⁻ region 131 isolates the n⁻ type region 101 into the n⁻ type region 101a and the n⁻ type region 101b. The n⁻ type region 101b is connected to the drain n⁺ region 103 through the polysilicon 304 formed of a high-resistance diffused resistor relative to the n⁻ type region 101a. As a result, the n⁻ type region 101b portion functions as a low-pass filter, and does not become an output capacitance component for from the drain terminal to the source terminal. For this reason, it is possible to reduce the source-drain capacitance Cds and the substrate-drain capacitance Cdsub according to the PN junction area of the n⁻ type region 101b with the p base region 105, the p⁻ well region 102, and the p⁻ type silicon substrate 100.

Embodiment 3

Figure 8:
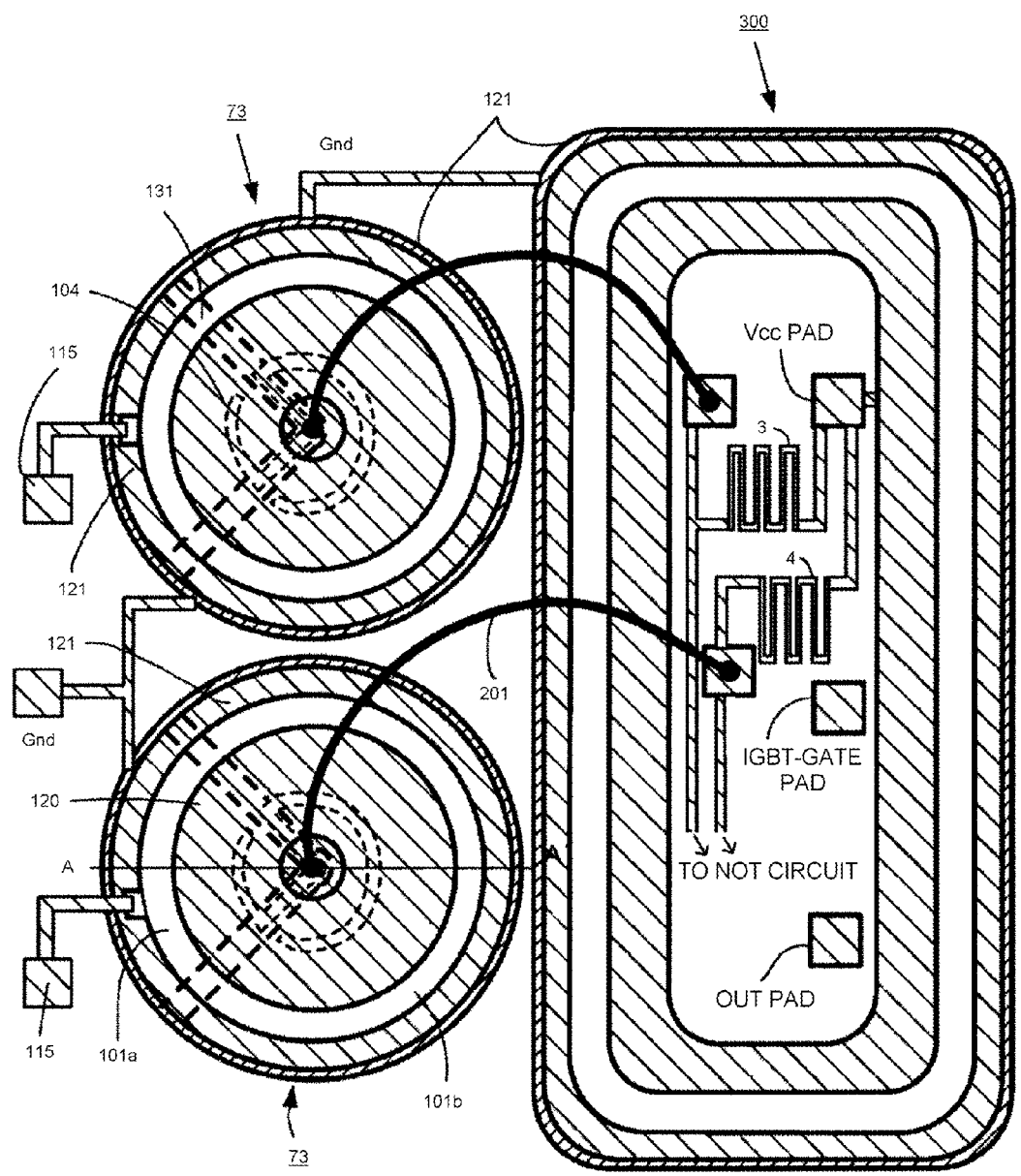
FIG. 8 is a plan view showing an essential part of a high breakdown voltage IC in which a level shift circuit including high breakdown voltage MOSFETs in accordance with Embodiment 3 of the present invention and a driving circuit including a floating potential region are formed in the same semiconductor substrate.

FIG. 8 is a plan view showing an essential part of a high breakdown voltage IC in which a level shift circuit including high breakdown voltage MOSFETs in accordance with Embodiment 3 of the present invention and a driving circuit including a floating potential region are formed in the same semiconductor substrate. The cross-sectional structure along the cut line A-A' of FIG. 8 is equal to the cross-sectional structure of the high breakdown voltage MOSFET shown in FIG. 1(a) of Embodiment 1. Incidentally, in FIG. 8, only the n offset region 104 and the p⁻ region 131 of the semiconductor regions forming a high breakdown voltage MOSFET 73 are indicated with broken lines.

The high breakdown voltage MOSFET 73 of FIG. 8 is different from the high breakdown voltage MOSFET 71 of FIG. 2 in that the planar shape of the p⁻region 131 is formed in the V shape. The n type region 101 is divided into, for example, an n⁻ type region 101a forming a fan-shaped planar shape formed of a minor arc, and an n⁻ type region 101b forming a fan-shaped planar shape formed of a major arc by the p⁻ region 131 forming a V-shaped planar shape.

The portions of the n offset region 104 formed in the n⁻ type region 101a and the n⁻ type region 101b form, for example, the circular-arc-shaped planar shapes, respectively. The circumferences of the portions of the n offset region 104 forming the circular-arc-shaped planar shapes are formed, for example, with lengths corresponding to the circumferences of fan shapes which are the planar shapes of the n⁻ type region 101a and the n⁻ type region 101b.

Namely, the circumference of the portions of the n offset region 104 forming the circular-arc-shaped planar shapes respectively formed in the n⁻ type region 101a and the n⁻ type region 101b is shorter than that of the n offset region 104 of Embodiment 1 in the n⁻ type region 101a, and longer than that of the n offset region 104 of Embodiment 1 in the n⁻ type region 101b.

The portion of the n offset region 104 formed in the p⁻ region 131 forms the V-shaped planar shape. On end of the portion of the n offset region 104 forming the circular-arc-shaped planar shape formed in the n⁻ type region 101a is connected to one end of the portion thereof forming the V-shaped planar shape formed in the p⁻ region 131. The one end of the portion of the n offset region 104 forming the circular-arc-shaped planar shape formed in the n⁻ type region 101b is connected to the other end of the portion thereof forming the V-shaped planar shape formed in the p⁻ region 131.

Thus, the p⁻ region 131 forming the V-shaped planar shape isolates the n⁻ type region 101, so that the area of the portion of the n⁻ type region 101 functioning as a MOSFET becomes about one quarter the conventional one. For this reason, with the high breakdown voltage MOSFET 73, it is possible to reduce the parasitic output capacitance by from 60% to 75% at maximum than that of a conventional high breakdown voltage MOSFET. The high breakdown voltage MOSFET is equal in configuration to the high breakdown voltage MOSFET in accordance with Embodiment 1, except for the planar shapes of the p⁻ region 131 and the n offset region 104.

Further, in the high breakdown voltage MOSFET 73, as with the high breakdown voltage MOSFET in accordance with Embodiment 2, the high resistance element connecting the n⁻ type region 101a and the n⁻ type region 101b may be formed of the polysilicon 304. Also when the high resistance element is formed of the polysilicon 304, similarly, the p⁻ region 131 can be formed in the V shape.

As described up to this point, in accordance with Embodiment 3, it is possible to obtain the same effects as with the high breakdown voltage MOSFETs in accordance with Embodiments 1 and 2.

Embodiment 4

Figure 9:
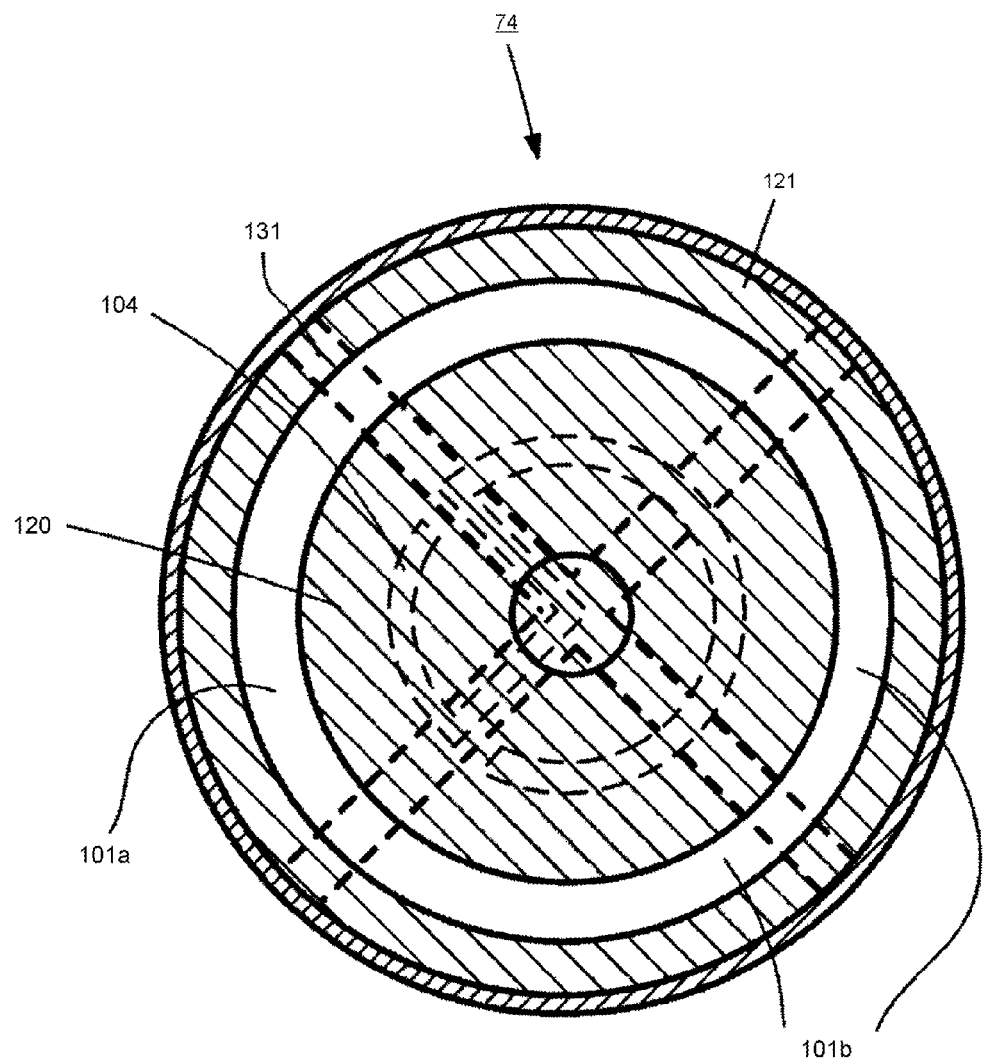
FIG. 9 is a plan view showing an essential part of a high breakdown voltage MOSFET in accordance with Embodiment 4 of the present invention.

FIG. 9 is a plan view showing an essential part of a high breakdown voltage MOSFET in accordance with Embodiment 4 of the present invention. Incidentally, in FIG. 9, only the n offset region 104 and the p⁻ region 131 of the semiconductor regions forming the high breakdown voltage MOSFET 74 are indicated with broken lines.

The high breakdown voltage MOSFET 74 of FIG. 9 is different from the high breakdown voltage MOSFET 73 of FIG. 8 in that the n⁻ type region 101b (the other region) is formed of a plurality of ones. Thus, the isolation region of the n⁻ type region 101 due to the p⁻ region 131 is not limited to one region. A plurality of the regions may be formed. The high breakdown voltage MOSFET 74 is equal in configuration to the high breakdown voltage MOSFET in accordance with Embodiment 1, except for the configuration in which the n⁻ type region 101 is isolated into a plurality of regions.

Further, in the high breakdown voltage MOSFET 74, as with the high breakdown voltage MOSFET in accordance with Embodiment 2, the high resistance element connecting the n⁻ type region 101a and the n⁻ type region 101b may be formed of the polysilicon 304. Also when the high resistance element is formed of the polysilicon 304, similarly, the n⁻ type region 101b (the other region) may be configured in a plurality of regions.

As described up to this point, in accordance with Embodiment 4, it is possible to obtain the same effects as with the high breakdown voltage MOSFETs in accordance with Embodiments 1 and 2.

Embodiment 5

Figure 10:
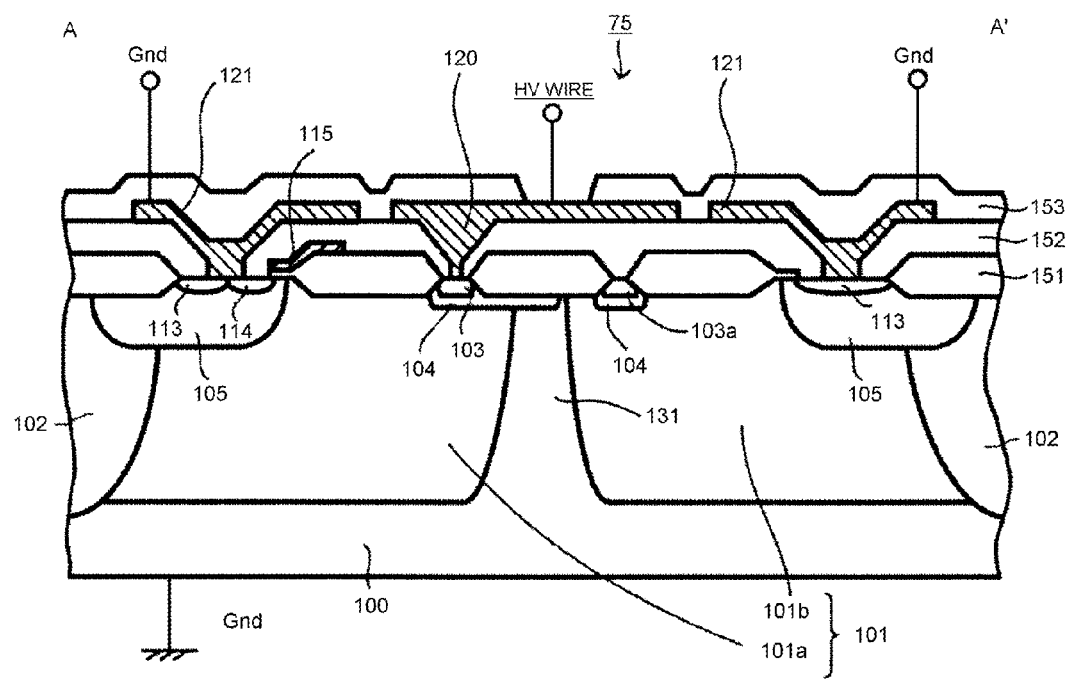
FIGS. 10a-10b are cross-sectional views showing an essential part of a high breakdown voltage MOSFET in accordance with Embodiment 5 of the present invention.
Figure 10:
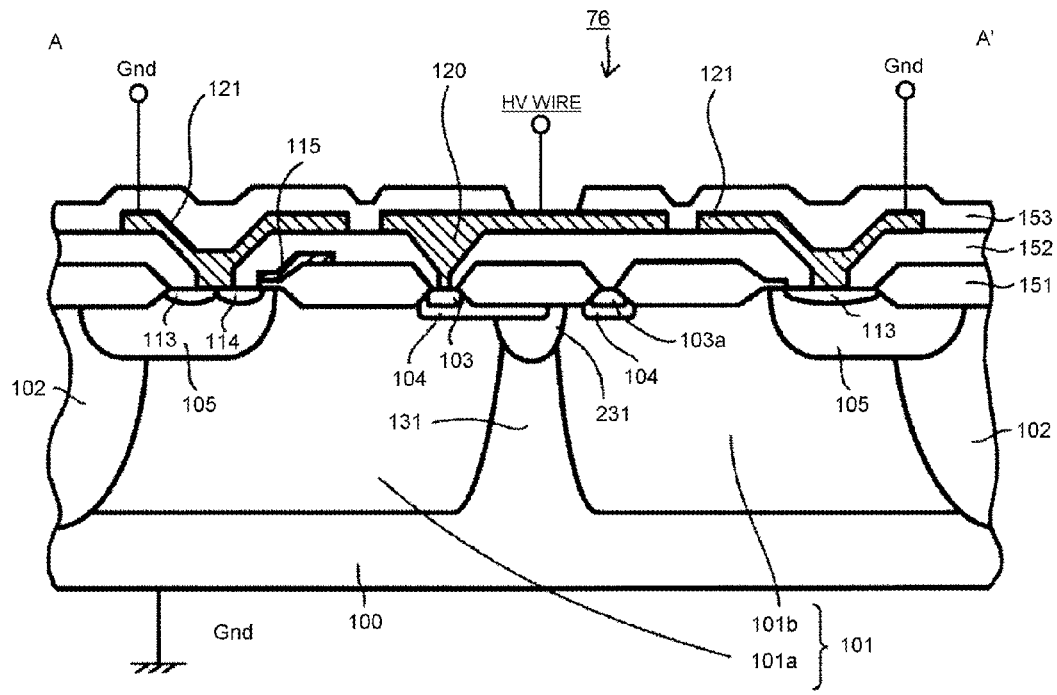

FIG. 10 is a cross-sectional view showing an essential part of a high breakdown voltage MOSFET in accordance with Embodiment 5 of the present invention. In the high breakdown voltage MOSFET 75 shown in FIG. 10(a), the p⁻ region 131 is formed of the p⁻ type silicon substrate 100 exposed at the surface. The high breakdown voltage MOSFET 75 is equal in configuration to the high breakdown voltage MOSFET in accordance with Embodiment 1, except for the p⁻ region 131.

Not limited to Embodiment 5, when in the high breakdown voltage MOSFET of the present invention, the n⁻ type region 101 is formed selectively in the surface layer of the p⁻ type silicon substrate 100 by impurity diffusion, the p⁻ region 131 isolating the n⁻ type region 101 is not limited to the diffusion layer, but may be in a structure in which the p⁻ type silicon substrate 100 is exposed at the surface. In that case, the width of the portion of the p⁻ type silicon substrate 100 exposed at the surface is formed to be a width such that the n⁻ type region 101a and the n⁻ type region 101b are not in contact with each other by transverse diffusion or the like.

Further, as with the high breakdown voltage MOSFET 76 shown in FIG. 10(b), the isolation region may be formed of a combination of a part at which the p⁻ type silicon substrate 100 is present between the n⁻ type region 101a and the n⁻ type region 101b, and the p⁻ region 231 which is a diffusion region.

Alternatively, in the high breakdown voltage MOSFETs 75 and 76, as with the high breakdown voltage MOSFET in accordance with Embodiment 2, the high resistance element connecting the n⁻ type region 101a and the n⁻ type region 101b may be formed of the polysilicon 304. Also when the high resistance element is formed of the polysilicon 304, the p⁻ region 131 may have a structure in which the p⁻ type silicon substrate 100 is exposed at the surface as in FIG. 10(a), or the isolation region may be formed of a combination of the p⁻ type silicon substrate 100 and the p⁻ region 231 which is the diffusion region as in FIG. 10(b).

As described up to this point, in accordance with Embodiment 5, it is possible to obtain the same effects as with the high breakdown voltage MOSFETs in accordance with Embodiments 1 and 2.

Embodiment 6

Figure 11:
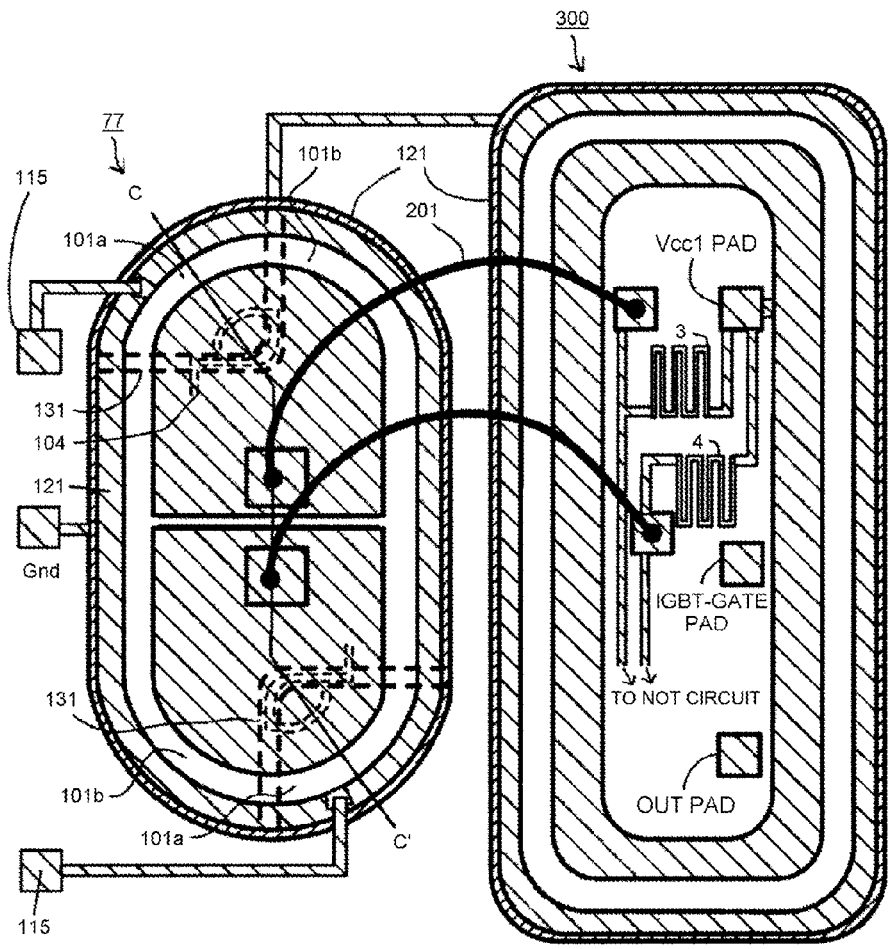
FIGS. 11a-11b are illustrative views showing an essential part of a high breakdown voltage IC in which a level shift circuit including high breakdown voltage MOSFETs in accordance with Embodiment 6 of the present invention and a driving circuit including a floating potential region are formed in the same semiconductor substrate.
Figure 11:
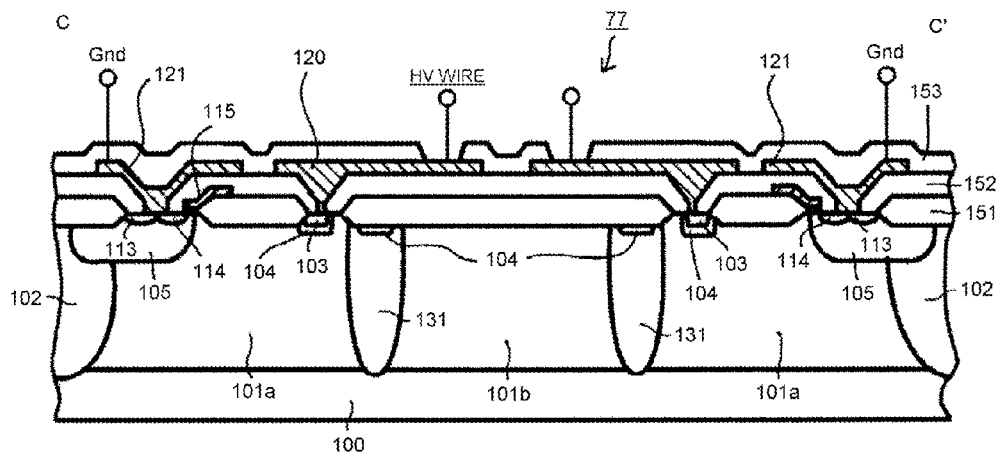

FIG. 11 is an illustrative view showing an essential part of a high breakdown voltage IC in which a level shift circuit including high breakdown voltage MOSFETs in accordance with Embodiment 6 of the present invention and a driving circuit including a floating potential region are formed in the same semiconductor substrate. FIG. 11(a) is a plan view showing the planar layout of an essential part of the high breakdown voltage IC. FIG. 11(b) is a cross-sectional view showing the cross-sectional structure along the cut line C-C' of FIG. 11(a).

In FIG. 11, the planar shape of the n⁻ type region 101 of the high breakdown voltage MOSFET 77 is an elliptical shape like a race track. Further, the p⁻ regions 131 which is the isolation region for the n⁻ type region 101 are formed at two parts, and isolate the n⁻ type region 101 into two n⁻ type regions 101a and one n⁻ type region 101b. The two n⁻ type regions 101a are respectively formed at the ends of the n⁻ type region 101 symmetrically across the origin point of the n⁻ type region 101 forming, for example, the elliptical planar shape. Then, in the two n⁻ type regions 101a, the high breakdown voltage MOSFETs are respectively formed.

The two high breakdown voltage MOSFETs 77 correspond to the high breakdown voltage MOSFETs 1 and 2 of FIG. 16, respectively. The floating potential region 300 is equal to the floating potential region shown in FIG. 2. The high breakdown voltage MOSFET 77 is equal in configuration to the high breakdown voltage MOSFET in accordance with Embodiment 1 except for the p⁻ region 131 and the n⁻ type region 101. Also in the high breakdown voltage MOSFET 77 with such a configuration, the region as the MOSFET can be reduced in size. For this reason, it is possible to reduce the output capacitance (Cds and Cdsub) while keeping the breakdown voltage.

Further, the high breakdown voltage MOSFET 77 of FIG. 11(a) is formed in the race track-shaped planar shape, and hence the area thereof can be made smaller than the two high breakdown voltage MOSFETs 71 of FIG. 2. Embodiment 6 shows the following: a plurality of isolation regions are formed by the p⁻ regions 131, to form a plurality of high breakdown voltage MOSFETs. However, the following configuration is also acceptable: in the high breakdown voltage IC having the race track-shaped planar shape, with one isolation region due to the p⁻ region 131, one high breakdown voltage MOSFET is formed.

For the high breakdown voltage MOSFET 77 in accordance with Embodiment 6, there was shown the case where the high resistance element was formed of the n offset region 104. However, as with the high breakdown voltage MOSFET in accordance with Embodiment 2, the high resistance element may be formed of the polysilicon 304.

As described up to this point, in accordance with Embodiment 6, it is possible to obtain the same effects as with the high breakdown voltage MOSFETs in accordance with Embodiments 1 and 2.

Embodiment 7

Figure 12:
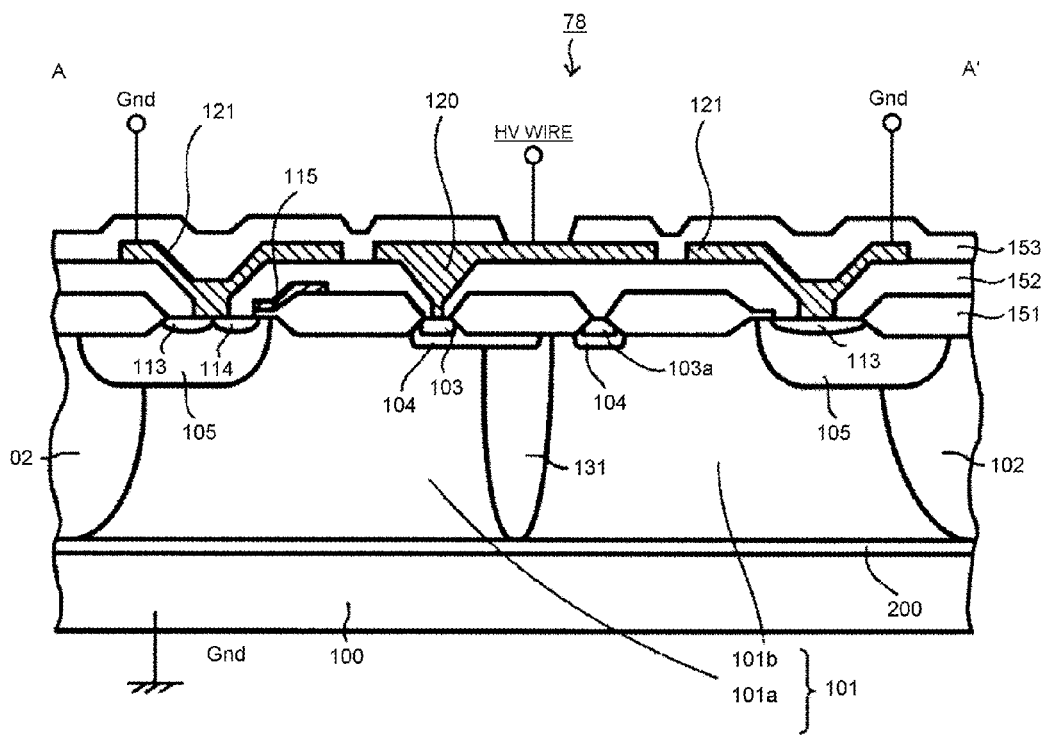
FIGS. 12a-12b are cross-sectional views showing an essential part of a high breakdown voltage MOSFET in accordance with Embodiment 7 of the present invention.
Figure 12:
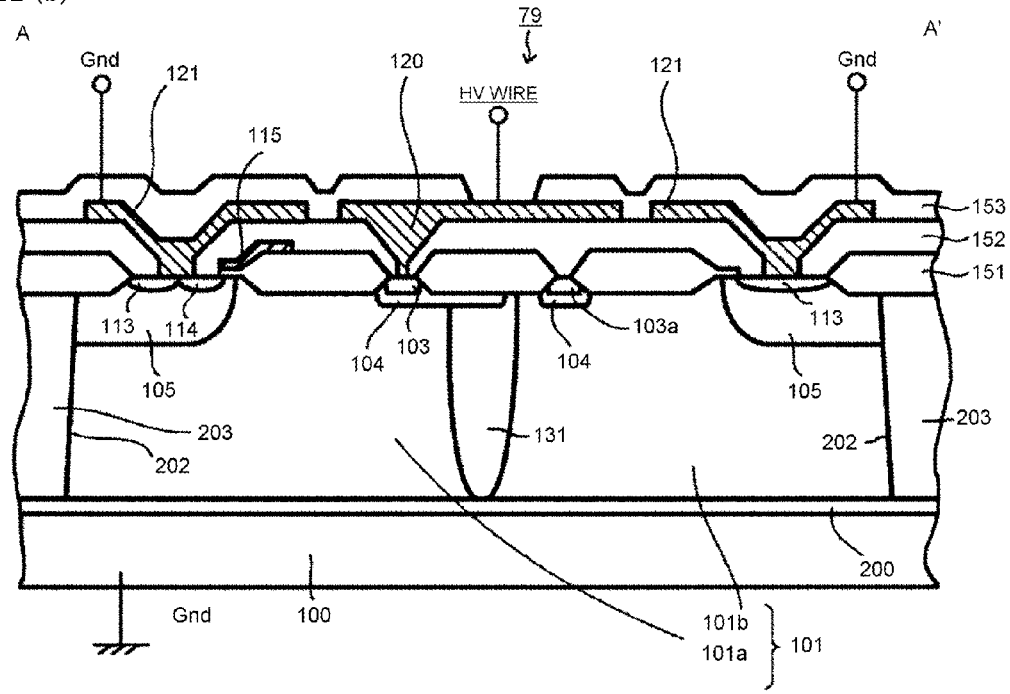

FIG. 12 is a cross-sectional view showing an essential part of a high breakdown voltage MOSFET in accordance with Embodiment 7 of the present invention. The high breakdown voltage MOSFETs 78 and 79 of FIG. 12 are different from the high breakdown voltage MOSFET 71 of FIG. 1 in that a SOI (Silicon-on-Insulator) substrate is used.

The high breakdown voltage MOSFET 78 of FIG. 12(a) is configured such that the p⁻ type silicon substrate 100 and a silicon substrate (SOI layer) as the n⁻ type region 101 are bonded together via the silicon oxide film 200. In this case, the phosphorus impurity concentration of the n⁻ type region 101 may desirably be $1\times10^{14}/cm^3$ or more and $1\times10^{15}/cm^3$ or less. Other configurations of the high breakdown voltage MOSFET 78 may be formed in the same manner as with the high breakdown voltage MOSFET 71 of FIG. 1.

The high breakdown voltage MOSFET 79 of FIG. 12(b) is, as with the high breakdown voltage MOSFET 78 of FIG. 12(a), configured such that the p⁻ type silicon substrate 100 and the silicon substrate as the n⁻ type region 101 are bonded together via the silicon oxide film 200. The high breakdown voltage MOSFET 79 is different from the high breakdown voltage MOSFET 78 of FIG. 12(a) in that as the isolation region, a dielectric isolation region formed of a trench 202 and an insulation film 203 made of a silicon oxide film or the like, and formed in the inner side of the trench 202 is formed in place of the p⁻ well region 102.

Also with the configuration as that of the high breakdown voltage MOSFET 78 or 79, it is possible to reduce the source-drain capacitance Cds while keeping the breakdown voltage. Further, also to the high breakdown voltage MOSFETs in accordance with Embodiments 2 to 6 described above, similarly, the configuration of the high breakdown voltage MOSFET 78 or 79 is applicable.

As described up to this point, in accordance with Embodiment 7, it is possible to obtain the same effects as those with the high breakdown voltage MOSFETs in accordance with Embodiments 1 to 6.

In respective Embodiments up to this point, a description was given to the high breakdown voltage ICs in each of which the high breakdown voltage MOSFET for level shift and the driving circuit including the floating potential region are integrated on the same semiconductor substrate. A driving circuit in which a high breakdown voltage MOSFET for level shift and a floating potential region are formed on separate semiconductor substrates also exerts the same effects as with the high breakdown voltage ICs of the respective Embodiments.

Embodiment 8

The application fields of the high breakdown voltage MOSFET of the present invention are not limited to the level shift element of the high breakdown voltage IC. The present invention is the technology also applicable to a MOSFET and an IGBT, and is suitable for the specification such that the breakdown voltage region for ensuring a high breakdown voltage has an area equivalent to or larger than that for the required current driving ability. By combining a MOSFET or an IGBT with the p⁻ region and the region connected to the drain region by a high resistance element of the present invention, it is possible to reduce the output capacitance while keeping the breakdown voltage characteristics.

Figure 13:
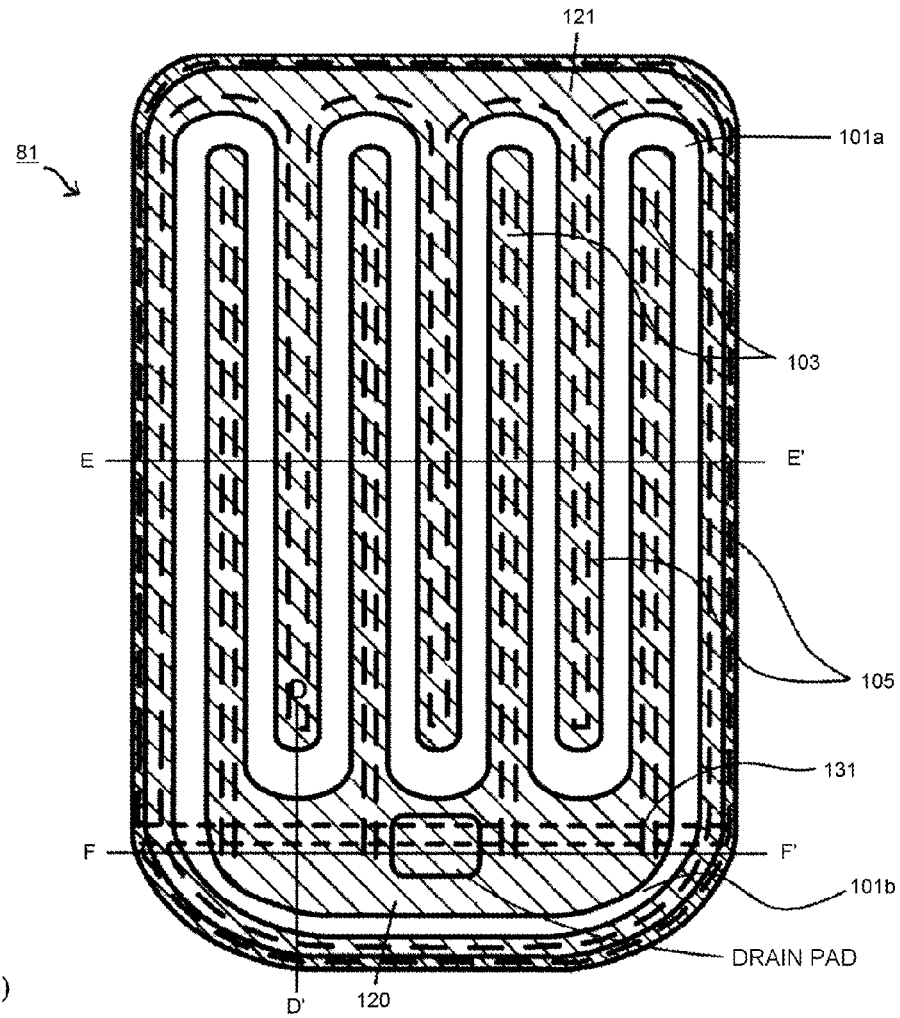
FIGS. 13a-13b are illustrative views showing an essential part of a high breakdown voltage MOSFET in accordance with Embodiment 8 of the present invention.
Figure 13:
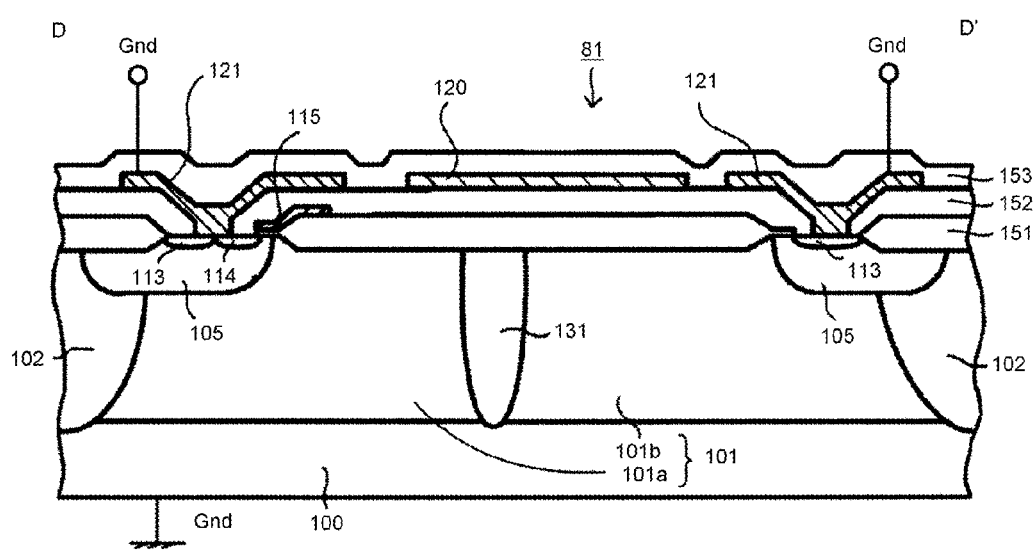
Figure 14:
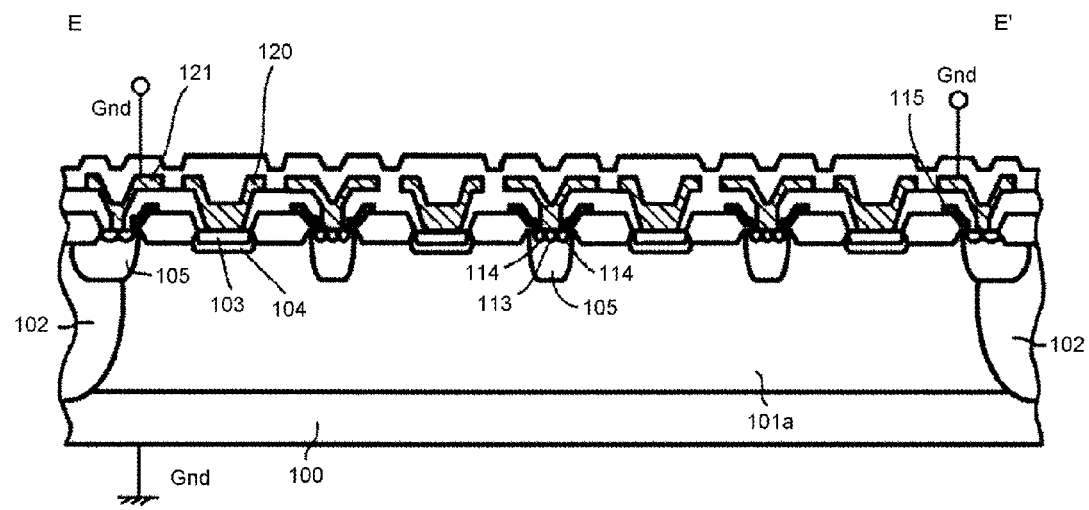
FIGS. 14a-14b are cross-sectional views showing the essential part of the high breakdown voltage MOSFET in accordance with Embodiment 8 of the present invention.
Figure 14:
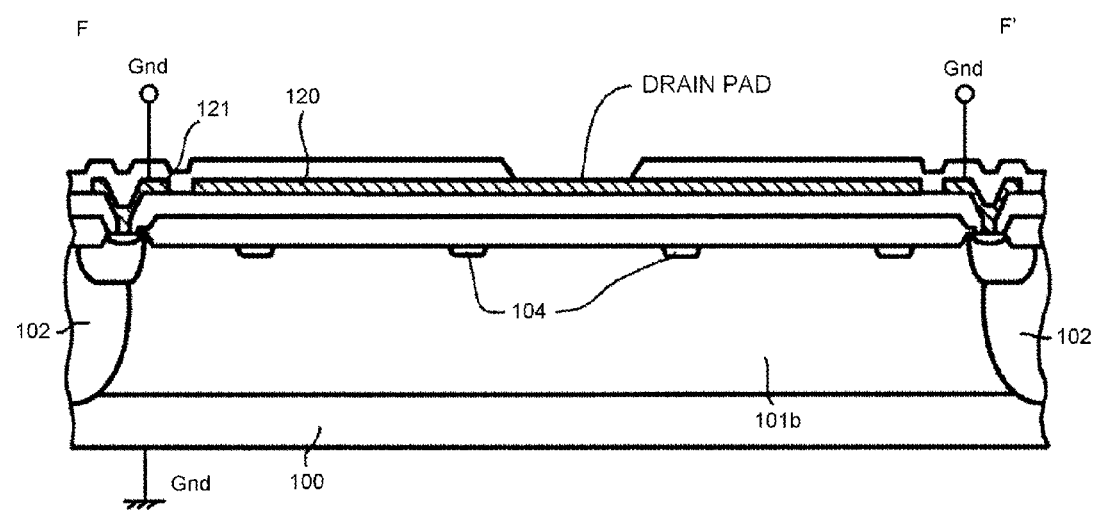

FIG. 13 is an illustrative view showing an essential part of a high breakdown voltage MOSFET in accordance with Embodiment 8 of the present invention. Whereas, FIG. 14 is a cross-sectional view showing the essential part of the high breakdown voltage MOSFET in accordance with Embodiment 8 of the present invention. FIG. 13($a$) is a plan view showing an essential part of the high breakdown voltage MOSFET. FIG. 13($b$) is a cross-sectional view along the cut line D-D' of FIG. 13($a$). FIG. 14($a$) is a cross-sectional view along the cut line E-E' of FIG. 13($a$). FIG. 14($b$) is a cross-sectional view along the cut line F-F' of FIG. 13($a$).

A high breakdown voltage MOSFET 81 is formed in such a manner that comb-teeth-shaped source electrode 121 and drain electrode 120 are opposed to each other. Further, under the straight line part of the comb-teeth-shaped drain electrode 120, the drain n⁺ region 103 and the n offset region 104 are formed. Whereas, under the straight line part of the comb-teeth-shaped source electrode 121, the source n⁺ region 114 is formed opposed to the drain n⁺ region 103. It is essential only that the gate electrode 115 is formed between the source n⁺ region 114 and the drain n⁺ region 103.

In Embodiment 8, the gate electrode 115 may be formed on the n⁻ type region 101$b$ (not shown). When on the n⁻ type region 101$b$, the gate electrode 115 is formed, the gate electrode 115 formed on the n⁻ type region 101$b$ is isolated from the gate electrode 115 formed on the n⁻ type region 101$a$. At this step, the potential of the gate electrode 115 formed on the n⁻ type region 101$b$ is connected to the common potential COM, or is set at a floating potential.

Also in the high breakdown voltage MOSFET 81 in accordance with Embodiment 8, the isolation region formed of the p⁻ region 131 is formed. As a result, the n⁻ type region 101 is isolated into the n⁻ type region 101$a$ and the n⁻ type region 101$b$. Thus, the n⁻ type region 101$b$ and the drain region 103 are connected to each other via a high resistance element. As a result, it is possible to reduce the output capacitance while keeping the element breakdown voltage.

Further, in the high breakdown voltage MOSFET 81 in accordance with Embodiment 8, as with the high breakdown voltage MOSFET in accordance with Embodiment 4, a plurality of the p⁻ regions 131 which are the isolation regions may be formed. Alternatively, as with the high breakdown voltage MOSFET in accordance with Embodiment 5, the p⁻ region 131 which is the isolation region may be configured of the p⁻ type silicon substrate 100 being exposed in place of being formed as a diffusion region, or may be configured of a combination of the p⁻ type silicon substrate 100 and a p⁻ region formed of a diffusion region.

Alternatively, the silicon substrate of the high breakdown voltage MOSFET 81 in accordance with Embodiment 8 may be a SOI substrate as with the high breakdown voltage MOSFET in accordance with Embodiment 7. Further, in Embodiment 8, there was shown the case where the high resistance element was formed of the n offset region 104. However, as with the high breakdown voltage MOSFET in accordance with Embodiment 2, the high resistance element may be formed of the polysilicon 304.

Figure 15:
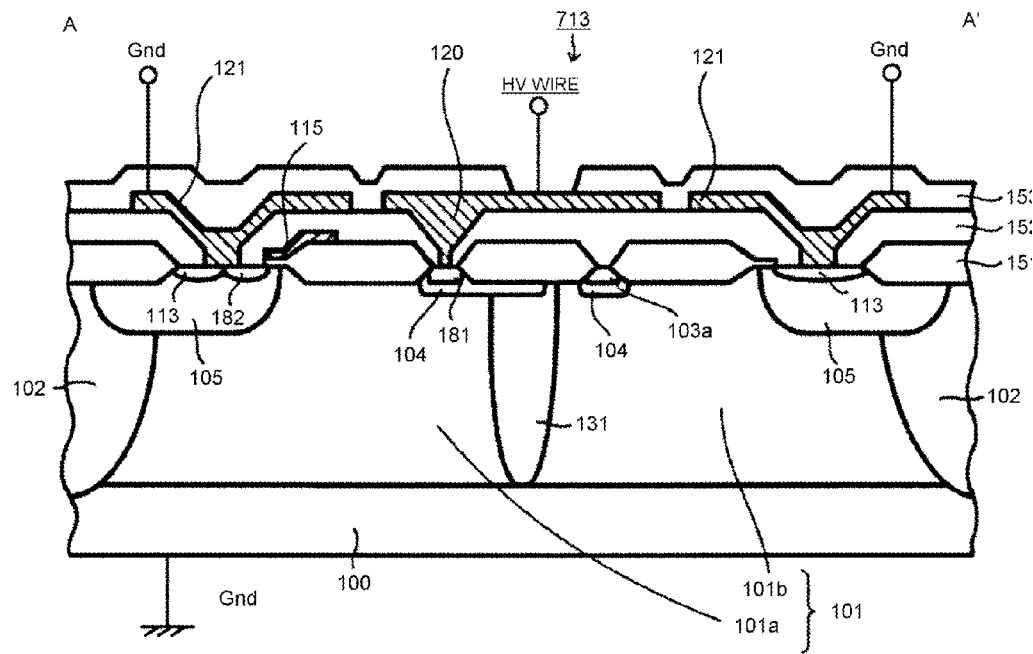
FIGS. 15a-15b are cross-sectional views showing another example of the cross-sectional structure along the cut line A-A' of FIG. 2.
Figure 15:
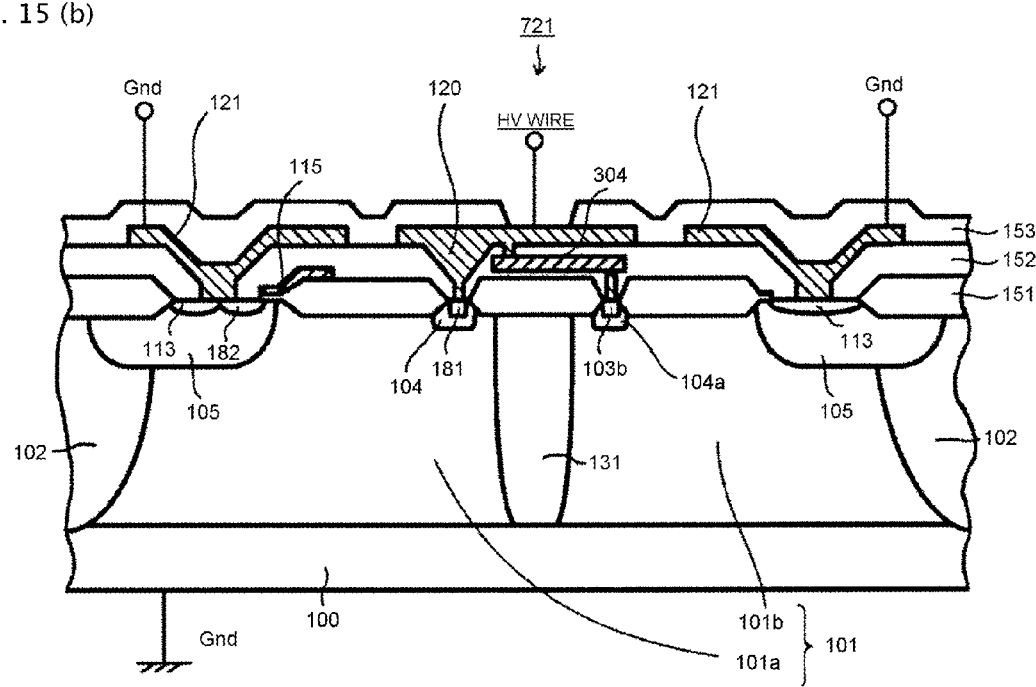

In the description up to this point, in the present invention, the high breakdown voltage MOSFET was described. However, the present invention is not limited to the foregoing embodiments, but is also applicable to an IGBT. Specifically, a description will be given by reference to FIG. 15. FIG. 15 is a cross-sectional view showing another example of the cross-sectional structure along the cut line A-A' of FIG. 2. As with the high breakdown voltage IGBT 713 shown in FIG. 15($a$), it may be configured as follows: a p⁺ type collector region 181 is formed in place of the drain n⁺ region 103 of the high breakdown voltage MOSFET shown in FIG. 1($a$), and the source n⁺ region 114 is set as an emitter n⁺ region 182 as it is. The n⁺ region 103$a$ may be not formed. Alternatively, as with the high breakdown voltage IGBT 721 shown in FIG. 15($b$), it may be configured as follows: the p⁺ type collector region 181 is formed in place of the drain n⁺ region 103 of the high breakdown voltage MOSFET shown in FIG. 6, and the source n⁺ region 114 is set as the emitter n⁺ region 182 as it is.

INDUSTRIAL APPLICABILITY

As described up to this point, the semiconductor device and the driving circuit in accordance with the present invention are useful for a level shift circuit for use in a semiconductor switching element of the upper arm of a bridge circuit for power inversion in, for example, a PWM inverter and a switching power source. Specifically, the semiconductor device and the driving circuit in accordance with the present invention are useful for a level shift circuit for use in the case where ON/OFF signals are transferred without performing potential insulation from a circuit connected to the common potential to a control electrode of a controllable semiconductor element fluctuating in potential of the electrode (such as an emitter or a source) serving as the potential reference for the control driving signal to be inputted with respect to the common potential such as ground. Further desirably, the semiconductor device and the driving circuit in accordance with the present invention are useful for the level shift circuit usable in the form of a HVIC (high breakdown voltage IC).

EXPLANATION OF REFERENCE NUMERALS 1, 2, 11 high breakdown voltage MOSFET
3, 4 load resistance 5, 6 constant voltage diodes
8, 9 NOT circuit
71, 72, 73, 74, 75, 76, 77, 78, 79, 81 high breakdown voltage MOSFET
15 RS flip-flop (RS-FF, RS latch)
16 driver
17, 18 IGBT
20 driver
21 reset terminal R
25 ON signal
26 OFF signal
30, 31 low-pass filter circuit
41, 42 diode
51, 52 output capacitance
61 control circuit
100 p⁻ type silicon substrate
101, 101a, 101b n⁻ type region
102 p⁻ well region
103 drain n⁺ region
104 n offset region
105 p base region
113 base pickup p⁺ region
114 source n⁺ region
115 gate electrode
120 drain electrode
121 source electrode
131, 231 p⁻ region
15 LOCOS
152 interlayer insulation film (silicon oxide film)
153 passivation film
200 silicon oxide film
201 bonding wire
202 trench
203 insulation film
300 floating potential region
COM common potential
Vdc main DC power source (positive electrode side)
OUT AC output terminal
E1, E2 auxiliary DC power source
Vcc1 positive electrode line
Vcc2 positive electrode line

The invention claimed is:

1. A semiconductor device, comprising:
a second conductivity type breakdown voltage region situated on a first conductivity type semiconductor substrate,
a second conductivity type drain diffusion region formed in a surface layer of a part of the breakdown voltage region,
a first conductivity type base region formed in contact with the breakdown voltage region in such a manner as to be apart from the drain diffusion region and to surround the drain diffusion region,
a first conductivity type pickup region formed in a surface layer of the base region,
a first main electrode connected to the pickup region,
a second main electrode connected to the drain diffusion region, and to be applied with a higher voltage than a voltage to be applied to the first main electrode, and
an isolation region in contact with the semiconductor substrate and surrounding the breakdown voltage region,
the breakdown voltage region including a drift region having the drain diffusion region, and another region not having the drain diffusion region and electrically connected to the drain diffusion region or the second main electrode via a high resistance element,
the semiconductor device further comprising:
a first conductivity type semiconductor region formed between the drift region and the other region so as to be in contact with the isolation region and the semiconductor substrate and to isolate the drift region and the other region from each other;
a second conductivity type source diffusion region situated in a surface layer of the base region in the drift region, and connected to the first main electrode; and
a gate electrode formed on a surface of the base region between the drift region and the source diffusion region via an insulation film,
wherein a resistance value R (Ω) of the high resistance element satisfies the following expression (1):

$$R \geq 1/(2\pi \cdot C \cdot fc) \qquad (1)$$

where
R: resistance value (Ω) of the high resistance element,
C: output capacitance (F) of the high breakdown voltage semiconductor device, and
fc: switching operation frequency (Hz) of the high breakdown voltage semiconductor device.

2. The semiconductor device according to claim 1, wherein the breakdown voltage region is a diffusion region selectively formed in a surface layer of the semiconductor substrate.

3. The semiconductor device according to claim 2, wherein the isolation region is a diffusion region selectively formed in the surface layer of the semiconductor substrate, and having a higher impurity concentration than that of the semiconductor substrate.

4. The semiconductor device according to claim 2, wherein the isolation region is formed of a trench formed from a surface of the semiconductor substrate, and an insulator embedded in the trench.

5. The semiconductor device according to claim 2, wherein the first conductivity type semiconductor region is a diffusion region selectively formed in the surface layer of the semiconductor substrate.

6. The semiconductor device according to claim 2, wherein the first conductivity type semiconductor region is a region of the semiconductor substrate exposed at a surface.

7. The semiconductor device according to claim 1, wherein the breakdown voltage region is a second conductivity type epitaxial growth layer formed on the semiconductor substrate.

8. The semiconductor device according to claim 7, wherein the isolation region is a diffusion region reaching the semiconductor substrate from a surface of the epitaxial growth layer, and having a higher impurity concentration than that of the semiconductor substrate.

9. The semiconductor device according to claim 7, wherein the isolation region is formed of a trench reaching the semiconductor substrate from a surface of the epitaxial growth layer, and an insulator embedded in the trench.

10. The semiconductor device according to claim 7, wherein the first conductivity type semiconductor region is formed of a diffusion region reaching the semiconductor substrate from a surface of the epitaxial growth layer.

11. The semiconductor device according to claim 1, wherein the breakdown voltage region is a region formed at a SOI layer formed on the semiconductor substrate via an insulation film.

12. The semiconductor device according to claim 11, wherein the isolation region is a diffusion region reaching the insulation film from a surface of the SOI layer, and having a higher impurity concentration than that of the semiconductor substrate.

13. The semiconductor device according to claim 11, wherein the isolation region is formed of a trench reaching the insulation film from a surface of the SOI layer, and an insulator embedded in the trench.

14. The semiconductor device according to claim 11, wherein the first conductivity type semiconductor region is a diffusion region reaching the insulation film from a surface of the SOI layer.

15. The semiconductor device according to claim 1, wherein the second main electrode or a field plate connected to the second main electrode is formed on the other region via an insulation film.

16. The semiconductor device according to claim 1, wherein the other region is formed of a plurality of regions, and the first conductivity type semiconductor regions are each provided between the plurality of regions.

17. The semiconductor device according to claim 1, wherein the drift region is formed of a plurality of regions, and the first conductivity type semiconductor regions are each provided between the plurality of regions.

18. The semiconductor device according to claim 1, wherein when a higher voltage than a voltage to be applied to the first main electrode is applied to the second main electrode, before occurrence of avalanche breakdown at a PN junction between the first conductivity type semiconductor region and the drift region or the other region, depletion regions extending from the PN junction to the first conductivity type semiconductor region are connected to each other.

19. A semiconductor device, comprising:
a second conductivity type breakdown voltage region situated on a first conductivity type semiconductor substrate,
a first conductivity type collector diffusion region formed in a surface layer of a part of the breakdown voltage region,
a first conductivity type base region formed in contact with the breakdown voltage region in such a manner as to be apart from the collector diffusion region and to surround the collector diffusion region,
a first conductivity type pickup region formed in a surface layer of the base region,
a first main electrode in contact with the pickup region,
a second main electrode connected to the collector diffusion region, and to be applied with a higher voltage than a voltage to be applied to the first main electrode, and
an isolation region in contact with the semiconductor substrate and surrounding the breakdown voltage region,
the breakdown voltage region including a drift region having the collector diffusion region, and another region not having the collector diffusion region and electrically connected to the collector diffusion region or the second main electrode via a high resistance element,
the semiconductor device further comprising:
a first conductivity type semiconductor region formed between the drift region and the other region so as to be in contact with the isolation region and the semiconductor substrate and to isolate the drift region and the other region from each other;
a second conductivity type emitter diffusion region situated in a surface layer of the base region in the drift region, and connected to the first main electrode; and
a gate electrode formed on a surface of the base region between the drift region and the emitter diffusion region via an insulation film,
wherein a resistance value R (Ω) of the high resistance element satisfies the following expression (2):

$$R \geq 1/(2\pi \cdot C \cdot fc) \qquad (2)$$

where
R: resistance value (Ω) of the high resistance element,
C: output capacitance (F) of the high breakdown voltage semiconductor device, and
fc: switching operation frequency (Hz) of the high breakdown voltage semiconductor device.

20. A driving circuit for driving gates of one or more output power devices each having one main terminal connected to a positive electrode of a main DC power source, and another main terminal connected to an AC output terminal,
the driving circuit comprising:
a high potential side low breakdown voltage circuit to be supplied with a current by a first auxiliary DC power source having a lower voltage than that of the main DC power source based on either one of the main terminals of each of the output power devices; and
a high breakdown voltage transistor for level shifting a signal from a low potential side low breakdown voltage circuit to be supplied with a current by a second auxiliary DC power source having a lower voltage than that of the main DC power source based on a negative electrode of the main DC power source, and transferring the signal to the high potential side low breakdown voltage circuit,
wherein the high breakdown voltage transistor is the semiconductor device including:
a second conductivity type breakdown voltage region situated on a first conductivity type semiconductor substrate,
a second conductivity type drain diffusion region formed in a surface layer of a part of the breakdown voltage region,
a first conductivity type base region formed in contact with the breakdown voltage region in such a manner as to be apart from the drain diffusion region and to surround the drain diffusion region,
a first conductivity type pickup region formed in a surface layer of the base region,
a first main electrode connected to the pickup region,
a second main electrode connected to the drain diffusion region, and to be applied with a higher voltage than a voltage to be applied to the first main electrode, and
an isolation region in contact with the semiconductor substrate and surrounding the breakdown voltage region,
the breakdown voltage region including a drift region having the drain diffusion region, and another region not having the drain diffusion region and electrically connected to the drain diffusion region or the second main electrode via a high resistance element,
the semiconductor device further comprising:
a first conductivity type semiconductor region formed between the drift region and the other region so as to be in contact with the isolation region and the semiconductor substrate and to isolate the drift region and the other region from each other;
a second conductivity type source diffusion region situated in a surface layer of the base region in the drift region, and connected to the first main electrode; and
a gate electrode formed on a surface of the base region between the drift region and the source diffusion region via an insulation film,
wherein a resistance value R (Ω) of the high resistance element satisfies the following expression (1):

$$R \geq 1/(2\pi \cdot C \cdot fc) \qquad (1)$$

where
R: resistance value (Ω) of the high resistance element,

C: output capacitance (F) of the high breakdown voltage semiconductor device, and fc: switching operation frequency (Hz) of the high breakdown voltage semiconductor device.

* * * * *